(12) United States Patent
Kokubo et al.

(10) Patent No.: US 7,459,379 B2
(45) Date of Patent: Dec. 2, 2008

(54) METHOD FOR MANUFACTURING SEMICONDUCTOR DEVICE

(75) Inventors: Chiho Kokubo, Tochigi (JP); Shunpei Yamazaki, Tokyo (JP); Tamae Takano, Kanagawa (JP); Hiroaki Irie, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 403 days.

(21) Appl. No.: 11/089,055

(22) Filed: Mar. 25, 2005

(65) Prior Publication Data

US 2005/0221545 A1    Oct. 6, 2005

(30) Foreign Application Priority Data

Mar. 26, 2004  (JP)  .............. 2004-093273

(51) Int. Cl.
*H01L 21/20* (2006.01)
(52) U.S. Cl. ................ 438/476; 438/487; 257/E21.134
(58) Field of Classification Search ................ 438/143, 438/473, 474, 476; 257/E21.318
See application file for complete search history.

(56) References Cited

U.S. PATENT DOCUMENTS

| | | | |
|---|---|---|---|
| 4,256,681 A | 3/1981 | Lindmayer | |
| 4,814,292 A | 3/1989 | Sasaki et al. | |
| 5,529,937 A | 6/1996 | Zhang et al. | |
| 5,569,610 A | 10/1996 | Zhang et al. | |
| 5,639,698 A | 6/1997 | Yamazaki et al. | |
| 5,643,826 A | 7/1997 | Ohtani et al. | |
| 5,663,077 A | 9/1997 | Adachi et al. | |
| 5,773,327 A | 6/1998 | Yamazaki et al. | |
| 5,824,573 A | 10/1998 | Zhang et al. | |
| 5,854,096 A | 12/1998 | Ohtani et al. | |
| 5,879,977 A | 3/1999 | Zhang et al. | |

(Continued)

FOREIGN PATENT DOCUMENTS

CN    1373503    10/2002

(Continued)

OTHER PUBLICATIONS

Abe et al., "AM-LCD '98 Digest of Technical Papers, High-Performance Poly-Crystalline Silicon TFTs Fabricated Using the SPC and ELA Methods", TFT3-2, pp. 85-88, Jan. 1, 1998.

(Continued)

*Primary Examiner*—Stephen W Smoot
(74) *Attorney, Agent, or Firm*—Nixon Peabody LLP; Jeffrey L. Costellia

(57) ABSTRACT

When a semiconductor film is irradiated with laser light, the semiconductor film is instantaneously melted and expand locally. In order to reduce internal stress generated by this expansion, strain is locally generated in the semiconductor film. Accordingly, a variation is caused among portions with strain and portions without strain, and a variation is caused also by a difference in extent of strain.

According to the present invention, after laser light irradiation, an oxide film (referred to as a chemical oxide) is formed by using a solution containing ozone (typically, ozone water) to form an oxide film of 1 to 10 nm in total, and further, a heat treatment for reducing strain of a semiconductor film (a heat treatment of heating the semiconductor film instantaneously to approximately 400 to 1000° C.) is performed.

30 Claims, 13 Drawing Sheets

U.S. PATENT DOCUMENTS

| | | | |
|---|---|---|---|
| 5,904,770 | A | 5/1999 | Ohtani et al. |
| 5,923,962 | A | 7/1999 | Ohtani et al. |
| 5,923,997 | A | 7/1999 | Mitanaga et al. |
| 5,948,496 | A | 9/1999 | Kinoshita et al. |
| 5,953,597 | A | 9/1999 | Kusumoto et al. |
| 6,014,944 | A | 1/2000 | Aklufi et al. |
| 6,066,516 | A | 5/2000 | Miyasaka |
| 6,184,068 | B1 | 2/2001 | Ohtani et al. |
| 6,281,057 | B2 | 8/2001 | Aya et al. |
| 6,285,042 | B1 | 9/2001 | Ohtani et al. |
| 6,319,761 | B1 | 11/2001 | Zhang et al. |
| 6,326,248 | B1 | 12/2001 | Ohtani et al. |
| 6,335,541 | B1 | 1/2002 | Ohtani et al. |
| 6,455,360 | B1 | 9/2002 | Miyasaka |
| 6,509,579 | B2 | 1/2003 | Takeya et al. |
| 6,716,768 | B2 | 4/2004 | Ikuta |
| 6,770,518 | B2 | 8/2004 | Yamazaki et al. |
| 6,808,968 | B2 | 10/2004 | Yamazaki et al. |
| 6,872,638 | B2 | 3/2005 | Yamazaki et al. |
| 7,160,784 | B2 | 1/2007 | Yamazaki et al. |
| 2001/0003659 | A1 | 6/2001 | Aya et al. |
| 2002/0098628 | A1 | 7/2002 | Hamada et al. |
| 2002/0119585 | A1 | 8/2002 | Yamazaki et al. |
| 2002/0119633 | A1 | 8/2002 | Yamazaki et al. |
| 2002/0125480 | A1 | 9/2002 | Nakamura et al. |
| 2002/0127827 | A1 | 9/2002 | Yamazaki et al. |
| 2002/0134981 | A1 | 9/2002 | Nakamura et al. |
| 2002/0146868 | A1 | 10/2002 | Miyasaka |
| 2002/0151120 | A1 | 10/2002 | Yamazaki et al. |
| 2002/0164843 | A1 | 11/2002 | Yamazaki et al. |
| 2002/0197785 | A1 | 12/2002 | Yamazaki et al. |
| 2003/0042484 | A1* | 3/2003 | Horikoshi et al. ............ 257/48 |
| 2003/0054595 | A1* | 3/2003 | Takemura .................. 438/166 |
| 2003/0082859 | A1* | 5/2003 | Ichijo et al. ................ 438/166 |
| 2003/0089909 | A1 | 5/2003 | Miyairi et al. |
| 2003/0109086 | A1* | 6/2003 | Arao ......................... 438/149 |
| 2004/0259389 | A1 | 12/2004 | Yamazaki et al. |
| 2005/0032336 | A1 | 2/2005 | Yamazaki et al. |
| 2006/0276012 | A1 | 12/2006 | Yamazaki et al. |

FOREIGN PATENT DOCUMENTS

| | | |
|---|---|---|
| CN | 1401142 | 3/2003 |
| EP | 0 651 431 A2 | 5/1995 |
| EP | 1 235 259 A1 | 8/2002 |
| JP | 06-163409 | 6/1994 |
| JP | 07-183540 | 7/1995 |
| JP | 11-074536 | 3/1999 |
| JP | 2000-150890 | 5/2000 |
| JP | 2000-305148 | 5/2000 |
| JP | 2002-076349 | 3/2002 |
| JP | 2002-261007 | 9/2002 |
| JP | 2002-261008 | 9/2002 |
| JP | 2002-305148 | 10/2002 |
| JP | 2002-329668 | 11/2002 |

OTHER PUBLICATIONS

Kimura et al., "AM-LCD '99 Digest of Technical Papers", "Device Simulation of Interface Roughness in Laser-crystallized p-Si TFTs", pp. 263-266, Jan. 1, 1999.

Australian Patent Office Search Report & Written Opinion, issued in Singapore, (Application No. 2002-00835-7; SG5551) Dated Apr. 20, 2004.

Australian Patent Office Search Report & Written Opinion, issued in Singapore, (Application No. 2002-00837-3; SG5561/5562) Dated Apr. 20, 2004.

Office Action of U.S. Appl. No. 10/078,240 dated Jun. 19, 2003.

Office Action from Chinese Patent Office for Application No. 200510076232.6, Dated: Dec. 14, 2007.

* cited by examiner 112
111
110

113

114a

114b

114c 115
114d

214a

216a 216b
214b

217

112
111
110

113

114a

114b 515
514a

514b 516a
514b 516b
514c

517

FIG. 13E folded state

METHOD FOR MANUFACTURING SEMICONDUCTOR DEVICE

BACKGROUND OF THE INVENTION

1. Field of the Invention

The present invention relates to a semiconductor device that has a circuit comprising a thin film transistor (hereinafter, referred to as a TFT) and a method for manufacturing the semiconductor device. For example, the invention relates to an electronic device carrying an electro-optical device typified by a liquid crystal display panel or a light-emitting display device that has an organic light-emitting element as a part thereof.

Note that the semiconductor device in the specification indicates overall devices that can function by using semiconductor properties, and electro-optical devices, semiconductor circuits, and electronic devices are all included in the semiconductor device.

2. Description of the Related Art

Recently, a technique for manufacturing a thin film transistor (TFT) with the use of a semiconductor film (approximately several to several hundred nm in thickness) formed over a substrate with an insulating surface has been attracting attention. The thin film transistor is widely applied to electronic devices such as an IC and an electro-optical device, and in particular, has been developed quickly as a switching element for image display devices.

As a material for a crystalline semiconductor film to be used for a TFT, silicon is mainly used. As a silicon film including a crystalline structure (hereinafter, referred to as a crystalline silicon film), a film obtained in such a way that an amorphous silicon film deposited on a substrate such as glass or quartz by plasma CVD or low-pressure CVD is crystallized by a heat treatment or laser light irradiation (hereinafter, referred to as a laser treatment in the specification) has been used.

In the laser treatment, high productivity can be obtained by forming a relatively large spot shape, for example, a square spot shape several cm square or a linear spot shape of 10 cm or more in length, at an irradiated surface. In particular, when the linear spot shape is used, the whole area of an irradiated surface can be irradiated with laser by scanning only in a direction perpendicular to the longitudinal direction of the linear laser light so that the productivity is higher, as compared with a case of using spot-shaped laser light requiring scanning back and forth and from side to side.

However, in crystallization by laser light irradiation, a precipitous temperature gradient may be generated between a substrate and a semiconductor film to lower the quality of a semiconductor film obtained after the laser light irradiation.

Consequently, the applicant has proposed Patent Reference 1, Patent Reference 2, Patent Reference 3, and Patent Reference 4 mentioned below.

In Patent Reference 3, a technique of reducing strain generated by laser light irradiation in such a way that a heat treatment is performed after crystallizing a semiconductor film by using laser light is described.

(Patent Reference 1) Japanese Patent Laid-Open No. 2002-305148
(Patent Reference 2) Japanese Patent Laid-Open No. 2002-329668
(Patent Reference 3) Japanese Patent Laid-Open No. 2002-261007
(Patent Reference 4) Japanese Patent Laid-Open No. 2002-261008

When a semiconductor film is irradiated with laser light, the semiconductor film is instantaneously melted and expand locally. In order to reduce internal stress generated by this expansion, strain is locally generated in the semiconductor film. Accordingly, a variation of the semiconductor film is caused among portions with strain and portions without strain, and a variation of the semiconductor film is caused also by a difference in extent of strain.

In addition, the semiconductor film is densified by crystallization. This densification can be confirmed by reduction in film thickness. The semiconductor film is contracted by crystallization, which contributes to generation of strain.

In a TFT, when there is strain in a semiconductor film to serve as an active layer, a potential barrier and a trap level are formed due to this strain. Accordingly, the interface state between the active layer and a gate insulating film becomes high. In addition, when there is strain in a semiconductor film to serve as an active layer, defects in operation of a TFT are caused because an electric field is not added to the semiconductor film uniformly.

Further, strain at the surface of a semiconductor film damages the flatness of a gate insulating film deposited by sputtering or CVD. Thus, insulation failure and the like is caused, which is one of causes of lowering the reliability of a TFT. As one of factors of determining field effect mobility, surface scattering is known, and the flatness at the interface between an active layer and a gate insulating film of a TFT has a great influence on the field effect mobility. The flatter the interface is, the less the field effect mobility is affected by scattering so that a higher field effect mobility can be obtained.

SUMMARY OF THE INVENTION

The present invention provides a method for reducing strain generated in a semiconductor film (to serve as an active layer of a TFT) due to laser light irradiation.

According to the present invention, after laser light irradiation, a heat treatment for reducing strain of a semiconductor film (a heat treatment of heating a semiconductor film instantaneously to approximately 400 to 1000° C.) is performed. Further, an oxide film (referred to as a chemical oxide) is formed by using a solution containing ozone (typically, ozone water) to form an oxide film of 1 to 10 nm in total thickness. Alternatively, by using an aqueous solution obtained by mixing a hydrogen peroxide solution with an acid such as sulfuric acid, hydrochloric acid, or nitric acid instead of the solution containing ozone, a chemical oxide can be formed similarly. After that, the formed oxide film is removed and a semiconductor film reduced in strain is obtained.

Before removing the oxide film, a heat treatment for reducing strain of the semiconductor film may be performed again, and then, the formed oxide film may be removed.

Alternatively, the following step may be performed for obtaining a semiconductor film reduced in strain, after laser light irradiation, an oxide film is formed by using a solution containing ozone to form an oxide film of 1 to 10 nm in thickness. After that, a heat treatment for reducing strain of the semiconductor film (a heat treatment of heating a semiconductor film instantaneously to approximately 400 to 1000° C.) is performed. Then, the formed oxide film may be removed. When the heat treatment is performed after forming the oxide film, an impurity such as a metal included in the film can be moved into the oxide film or the interface thereof, and also, the semiconductor film in which the impurity is reduced can be obtained by removing the oxide film.

Alternatively, after laser light irradiation, a patterning step of a semiconductor film, a heat treatment step for reducing strain of the semiconductor film, a step of forming an oxide film by using a solution containing ozone to form an oxide film of 1 to 10 nm in total thickness, and a step of removing the oxide film may be performed sequentially. In order to reduce the number of steps, a gate insulating film may be formed without removing the oxide film.

Alternatively, after laser light irradiation, a patterning step of a semiconductor film, a step of forming an oxide film of 1 to 10 nm by using a solution containing ozone, a heat treatment step for reducing strain of the semiconductor film, and a step of removing the oxide film may be performed sequentially. In order to reduce the number of steps, a gate insulating film may be formed over the oxide film without removing the oxide film.

The applicant discloses a technique of manufacturing a semiconductor film including a crystalline structure by adding a metal element (for example, nickel) for promoting crystallization of a semiconductor film to a semiconductor film including an amorphous structure (Japanese Patent Laid-Open No. 7-183540). This technique has not only the advantage of decreasing a heating temperature required for crystallization, but also the advantage of being able to improve the orientation in a certain direction. When the semiconductor film including such a crystalline structure is used to form a TFT, the subthreshold factor (s-factor) becomes smaller as well as improving the field effect mobility so that the electrical characteristics can be improved dramatically.

Because nucleation in crystallization can be controlled by using the metal element for promoting crystallization, an obtained film is more uniform as compared with a film obtained by another crystallization method involving random nucleation. It is desirable to reduce the metal element completely or reduce the metal element into the allowable range of density. However, since the metal element for promoting crystallization is added, the metal element remains in the semiconductor film including the crystalline structure or at the surface of the film to result in problems such as variations in obtained-device characteristics. As an example thereof, there is a problem that the OFF current of a TFT is increased to result in a variation among individual devices. Namely, the metal element for promoting crystallization becomes unnecessary when the semiconductor film including the crystalline structure is formed once.

Consequently, gettering for removing the metal element is performed. If gettering is not performed sufficiently within a substrate and a variation in gettering level is unignorable, slight differences among respective TFT characteristics, that is, a variation of characteristics is generated. In the case of a transmissive liquid crystal display device, when TFTs arranged in a pixel portion show a variation in electrical characteristics, a variation in threshold voltages of the TFTs is generated. Therefore, a variation in transmitted light intensity is generated, which is seen by viewer's eyes as display unevenness.

For a light-emitting device that has a layer including an organic compound as a light-emitting layer (a light-emitting device that has an EL element), a TFT is an essential element to realize an active matrix driving method. Accordingly, in a light-emitting device using an EL element, at least a TFT that serves as a switching element and a TFT for supplying current to the EL element are provided in each pixel. Independently of the circuit structure of a pixel and a driving method, the luminance of the pixel is determined by the ON current ($I_{on}$) of the TFT connected to the EL element for supplying current to the EL element. Therefore, for example, in the case of overall white display, there is a problem that a variation in luminance is generated unless the ON current is constant.

The present invention also provides a technique for removing the metal element remaining in the film effectively after obtaining a semiconductor film including a crystalline structure with the use of a metal element for promoting crystallization of a semiconductor film.

The present invention has a feature of performing at least one of a step of performing a heat treatment for reducing strain of a semiconductor film (a heat treatment of heating a semiconductor film instantaneously to approximately 400 to 1000° C.) and a step of forming an oxide film (a barrier layer) to serve as an etching stopper by using a solution containing ozone before forming a second semiconductor film (a gettering site) including a rare gas element. By performing these steps, the metal element can be gettered more effectively so that the density of the metal element in the semiconductor film can be reduced to suppress the variation of the characteristics of the TFTs.

A configuration of the invention disclosed in the specification includes a step of forming a first semiconductor film including a crystalline structure over an insulating surface with the use of a metal element, a step of irradiating the first semiconductor film with laser light, a step of performing a heat treatment for reducing strain of the first semiconductor film (a heat treatment of heating the first semiconductor film instantaneously to approximately 400 to 1000° C.), a step of forming an oxide film (a barrier layer) to serve as an etching stopper by using a solution containing ozone, a step of forming a second semiconductor film (a gettering site) including a rare gas element, a step of moving the metal element into the gettering site (the second semiconductor film) by a heat treatment, a step of removing the second semiconductor film, and a step of removing the oxide film.

When a semiconductor film is irradiated with laser light for crystallization or improving the crystallinity, the semiconductor film is melted instantaneously from the surface, and then, by heat conduction to a substrate, the melted semiconductor film is cooled and solidify from the substrate side. In this solidification step, the semiconductor film is crystallized and becomes a semiconductor film including a crystalline structure having a larger grain size. However, since the semiconductor film is melted once, cubical expansion is generated and a convexity referred to as a ridge at the surface of the semiconductor film. In particular, in the case of a top gate TFT, device characteristics are influenced significantly since the surface with the ridge is an interface between a gate insulating film and the semiconductor film. In addition, a thin oxide film is formed at the surface of the semiconductor film by oxygen in an atmosphere when laser light irradiation is performed. Because the thickness and the uniformity of this oxide film are not predictable, it is preferable to remove the oxide film. However, because a watermark is easily generated in drying of the water-shedding surface, it is preferable that an oxide film is formed by using a solution containing ozone after the removal of the oxide film to prevent generation of a water mark.

However, because the surface oxide film formed by laser light irradiation is harder than an oxide film formed by using a solution containing ozone, the surface oxide film is superior as an oxide film (a barrier layer) to serve as an etching stopper. Accordingly, it is not particularly necessary to remove the surface oxide film formed by laser light irradiation since the number of steps can also be reduced.

When laser light irradiation is performed after adding a metal element (for example, nickel), the metal element tends to segregate more at the ridge. At the ridge with more nickel, NiSix is formed, and solidifies last in melting. NiSix easily dissolves in diluted hydrofluoric acid and an alkali etchant.

Therefore, when there are portions with more nickel in places and the oxide film (barrier layer) to serve as an etching stopper is insufficient in thickness, there is a risk that NiSix is removed by etching for removing the second semiconductor film and a minute hole (also referred to as a pinhole) is formed in the first semiconductor film.

In addition, at the ridge with more nickel, NiOx is also easily formed. NiOx is soft and has acid solubility. When the oxide film (barrier layer) to serve as an etching stopper is insufficient, there is a risk that NiOx is removed in a step to be performed later (etching for removing the second semiconductor film or a treatment before forming a gate insulating film) and a minute hole (a pinhole) is formed in the first semiconductor film.

When a minute hole (a pinhole) is formed in a semiconductor film to serve as an active layer, a defective state of covering the semiconductor film by a gate insulating film is generated, which results in a display defect such as a point defect.

In the present invention, after laser light irradiation, a first semiconductor film is heated instantaneously to approximately 400 to 1000° C. to reduce strain and ridges, and then, an oxide film (a barrier layer) that is uniform in film thickness is formed by using a solution containing ozone. This oxide film (barrier layer) serves as to protect the first semiconductor film during etching for removing the second semiconductor film. When the first semiconductor film is heated instantaneously to approximately 400 to 1000° C., strain is removed so as to easily perform gettering of nickel in a gettering step later.

Additionally, before performing a treatment before forming a gate insulating film, it is preferable that an oxide film (a barrier layer) that is uniform in film thickness is formed again by using a solution containing ozone to protect the first semiconductor film.

Note that methods for forming the second semiconductor film described above include sputtering and plasma CVD. Plasma CVD needs less maintenance as compared with sputtering because the inside of a deposition chamber (also referred to as a chamber) can be cleaned with the use of gas. Accordingly, it is said that plasma CVD is suitable for mass production. The film thickness of the oxide film (the barrier layer) is as thin as 1 to 10 nm. Therefore, when the second semiconductor film is formed on the oxide film (the barrier layer) by plasma CVD, there is a risk that the oxide film (the barrier layer) is partially destroyed by, for example, plasma generated during deposition. When the oxide film (the barrier layer) is partially destroyed, the oxide film (the barrier layer) insufficiently functions as an etching stopper in removing the second semiconductor film by etching to be performed later so that defects such as a variation in film thickness of the first semiconductor film and holes formed in the first semiconductor film are caused.

Consequently, a heat treatment (heating instantaneously to approximately 400 to 1000° C.) is performed to the oxide film (the barrier layer) to form a hard oxide film, by which the first semiconductor film is protected from damage of plasma. By damaging intentionally only the oxide film (the barrier layer) with protecting the first semiconductor film by plasma during forming the second semiconductor film to form strain and a dangling bond in the oxide film (the barrier layer), the metal element moving in such a direction as to reduce the strain can be made to pass effectively through the oxide film, move into and be trapped in the gettering site (the second semiconductor film). In case of damaging intentionally the oxide film (the barrier layer) by plasma during forming the second semiconductor film, it is preferable to increase the RF power density in plasma CVD. For example, the RF power may be controlled to be 300 W (0.052 W/cm$^2$), 400 W (0.069 W/cm$^2$), or 400 W or more.

Alternatively, when the flow ratio (SiH$_4$:rare gas) of a rare gas to monosilane introduced into a deposition chamber, the RF power density, and the pressure are controlled to form the second semiconductor film by plasma CVD, damage to the oxide film (the barrier layer) can be also reduced and variation in the film thickness of the first semiconductor film and defects of holes formed in the first semiconductor film can be suppressed. For example, the RF power may be controlled to be 100 W (0.017 W/cm$^2$), or 100 W or less.

A more detailed configuration of the invention is a method for manufacturing a semiconductor device, which includes a first step of forming a first semiconductor film including an amorphous structure on an insulating surface, a second step of adding a metal element to the first semiconductor film including the amorphous structure, a third step of crystallizing the first semiconductor film to form a first semiconductor film including a crystalline structure, a fourth step of irradiating the first semiconductor film with laser light, a fifth step of performing a first heat treatment to the first semiconductor film to reduce strain thereof, a sixth step of oxidizing a surface of the first semiconductor film by using a solution including ozone to form a barrier layer, a seventh step of forming a second semiconductor film including a rare gas element on the barrier layer, an eighth step of performing a second heat treatment to remove or reduce metal element in the first semiconductor film by moving the metal element into the second semiconductor film, a ninth step of removing the second semiconductor film; and a tenth step of removing the barrier layer, as shown in FIGS. 2A to 2I.

The first heat treatment may be performed after the step of forming the oxide film (the barrier layer) by the using the solution including ozone. Therefore, another configuration of the invention is a method for manufacturing a semiconductor device, which includes a first step of forming a first semiconductor film including an amorphous structure on an insulating surface, a second step of adding a metal element to the first semiconductor film including the amorphous structure, a third step of crystallizing the first semiconductor film to form a first semiconductor film including a crystalline structure, a fourth step of irradiating the first semiconductor film with laser light, a fifth step of oxidizing a surface of the first semiconductor film by using a solution including ozone to form a barrier layer, a sixth step of performing a first heat treatment to reduce strain of the first semiconductor film, a seventh step of forming a second semiconductor film including a rare gas element on the barrier layer, an eighth step of performing a second heat treatment to remove or reduce the metal element in the first semiconductor film by moving the metal element into the second semiconductor film, a ninth step of removing the second semiconductor film, and a tenth step of removing the barrier layer, as shown in FIGS. 6A to 6I.

A heat treatment for reducing strain of a semiconductor film may be performed twice before and after the step of forming the oxide the oxide film (the barrier layer) by the using the solution including ozone. Therefore, another configuration of the invention is a method for manufacturing a semiconductor device, which includes a first step of forming a first semiconductor film including an amorphous structure on an insulating surface, a second step of adding a metal element to the first semiconductor film including the amorphous structure, a third step of crystallizing the first semiconductor film to form a first semiconductor film including a crystalline structure, a fourth step of irradiating the first semiconductor film with laser light, a fifth step of performing a first heat treatment to reduce strain of the first semiconductor film, a sixth step of oxidizing a surface of the first semiconductor film by using a solution including ozone to form a barrier layer, a seventh step of performing a second heat treatment to further reduce strain of the first semiconductor film, an eighth step of forming a second semiconductor film including a rare gas element on the barrier layer, a ninth step of performing a third heat treatment to remove or reduce the metal element in the first second semiconductor film by moving the metal element into the second semiconductor film, a tenth step of removing the second semiconductor film, and an eleventh step of removing the barrier layer, as shown in FIGS. 3A to 3J.

In each configuration described above, a native oxide film formed at the surface of the first semiconductor film may be removed by cleaning the surface of the semiconductor film before the step of irradiating the first semiconductor film with laser light.

Further, in each configuration described above, a surface oxide film formed by the laser light irradiation may be removed after the step of irradiating the first semiconductor film with laser light.

Further, in each configuration described above, the barrier layer is one of a silicon oxide film and a silicon oxynitride film of 1 to 10 nm in film thickness. Note that the barrier layer indicates all oxide film formed at the surface of the first semiconductor film before forming the gattering site (the second semiconductor film). When there is no step of removing an oxide film before forming the gattering site (the second semiconductor film), the native oxide film, the surface oxide film by the laser light irradiation, and the oxide film (chemical oxide) formed by using the solution including ozone may be all included with being mixed or laminated.

Further, in each configuration described above, the metal element for promoting crystallization is one or more kinds selected from the group consisting of Fe, Ni, Co, Ru, Rh, Pd, Os, Ir, Pt, Cu, and Au.

Further, in each configuration described above, the rare gas element is one or more kinds selected from the group consisting of He, Ne, Ar, Kr, and Xe. Above all, argon (Ar), which is an inexpensive gas, is preferable for mass production.

The present invention can reduce strain generated in a semiconductor film (to serve as an active layer of a TFT) by laser light irradiation.

In the case of adding a metal element for crystallization to the first semiconductor film, a condition under which the metal element easily moves to a gettering site can be obtained by performing a heat treatment for reducing strain of a semiconductor film by laser light irradiation before a heat treatment for gettering.

In addition, an oxide film obtained according to the present invention protects the first semiconductor film from an etchant including an acid and the like in steps performed after laser light irradiation (for example, etching for removing the second semiconductor film and a treatment before forming the gate insulating film) so that a minute hole (also referred to as a pinhole) can be prevented from being formed. Accordingly, the present invention can reduce defective pixels such as point defects to improve a yield.

BRIEF DESCRIPTION OF THE DRAWINGS

In the accompanying drawings:

FIGS. 13A to 13E are diagrams illustrating examples of electronic devices.

DETAILED DESCRIPTION OF THE INVENTION

Embodiment modes of the present invention will be described below.

Embodiment Mode 1

A typical process for manufacturing a TFT by using the present invention will be briefly described below with reference to FIGS. 1A to 1F. An example of performing an oxidation treatment with a solution containing ozone and a heat treatment for reducing strain after patterning of a semiconductor film into a desired shape is shown here.

Figure 1A:
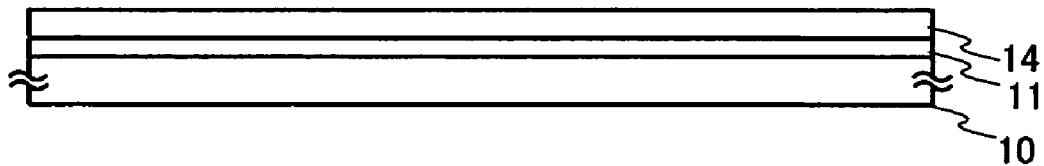
FIGS. 1A to 1F are diagrams illustrating a manufacturing process according to the present invention (Embodiment Mode 1)

In FIG. 1A, reference numeral 10 denotes a substrate that has an insulating surface, reference numeral 11 denotes a base insulating film, and reference numeral 14 denotes a semiconductor film having a crystalline structure by laser light irradiation.

In FIG. 1A, a glass substrate, a quartz substrate, a ceramic substrate, and the like can be used as the substrate 10. Also, a silicon substrate, a metal substrate, or a stainless substrate with an insulating film formed on the surface thereof may be used. In addition, a heat-resistant plastic substrate that can withstand processing temperatures in the process may be used.

First, as shown in FIG. 1A, the base insulating film 11 formed of an insulating film such as a silicon oxide film, a silicon nitride film, or a silicon oxynitride film ($SiO_xN_y$) is formed on the substrate 10. In a representative example, the base insulating film 11 has a two layer structure, for which a silicon nitride oxide film having a thickness of 50 to 100 nm formed by using $SiH_4$, $NH_3$, and $N_2O$ as reaction gases and a silicon oxynitride film having a thickness of 100 to 150 nm formed by using $SiH_4$ and $N_2O$ as reaction gases are laminated. As one layer of the base insulating film 11, it is preferable to use a silicon nitride film (SiN film) or a silicon oxynitride film ($SiO_xN_y$ (X>Y) film) of 10 nm or less in film thickness. In gettering, nickel tends to move easily to a region including a higher density of oxygen. Therefore, it is highly effective to use a silicon nitride film as the base insulating film 11 in contact with the semiconductor film 14. Alternatively, a three layer structure in which a silicon nitride oxide film, a silicon oxynitride film, and a silicon nitride film are sequentially laminated may be used.

Next, a semiconductor film including an amorphous structure is formed on the base insulating film 11. For the semiconductor film, a semiconductor material containing silicon as its main component is used. Typically, after forming an amorphous silicon film or an amorphous silicon-germanium film by a known method (for example, sputtering, LPCVD, or plasma CVD), a known crystallization treatment (laser crystallization, thermal crystallization, thermal crystallization using a catalyst such as nickel) is performed to obtain a semiconductor film including a crystalline structure.

Alternatively, by controlling the deposition condition appropriately, a semiconductor film including a crystalline structure (for example, a polycrystalline silicon film, a microcrystalline semiconductor film (also referred to as a semiamorphous semiconductor film)) may be obtained only by performing deposition. For example, a semiconductor film including a crystalline structure is formed directly on a substrate to be processed by introducing a silicide gas (for example, monosilane, disilane, or trisilane) and fluorine (or a halogen fluoride gas) into a deposition chamber as material gases and generating plasma.

FIG. 1A is a cross-sectional view after a step of irradiating the semiconductor film 14 with laser light. In the case of obtaining a semiconductor film including a crystalline structure by laser crystallization, the step indicates a crystallization step. FIG. 1A also shows a cross-sectional view of a step in the case of laser light irradiation for enhancing a degree of crystallinity of a semiconductor film including a crystalline structure obtained by a method other than laser crystallization. In the case of laser light irradiation for enhancing the degree of crystallinity, it is preferable to remove a native oxide film formed on the surface in a crystallization step before the laser light irradiation.

In any case, when laser light irradiation is performed, strain and ridges are formed in the semiconductor film, and a thin surface oxide film is formed at the surface of the semiconductor film 14. Since a film thickness and uniformity of this thin oxide film are not predictable, it is preferable to remove the oxide film. However, since a watermark is easily generated in drying of the water-shedding surface, it is preferable that another oxide film is formed by using a solution containing ozone after removing the surface oxide film to prevent generation of a water mark. In order to reduce the number of steps, the removal of the surface oxide film formed by the laser light irradiation may be unnecessary.

As a laser oscillator to be used for the laser light irradiation, a laser oscillator capable of emitting ultraviolet light, visible light, or infrared light can be used. As the laser oscillator, an excimer laser oscillator using KrF, ArF, XeCl, Xe, or the like, a gas laser oscillator using He, He—Cd, Ar, He—Ne, HF, or the like, a solid laser oscillator using a crystal such as YAG, $GdVO_4$, $YV_4$, YLF, or $YAlO_3$ doped with Cr, Nd, Er, Ho, Ce, Co, Ti, or Tm, and a semiconductor laser oscillator using GaN, GaAs, GaAlAs, InGaAsP, or the like can be used. In the case of the solid laser oscialltor, it is preferable to apply the first to fifth harmonics of the fundamental wave.

Typically, excimer laser light with a wavelength of 400 nm or less or the second or third harmonic of a YAG laser is used as the laser light. For example, pulsed laser light with a repetition frequency of 10 Hz to 100 MHz is used.

Figure 1B:
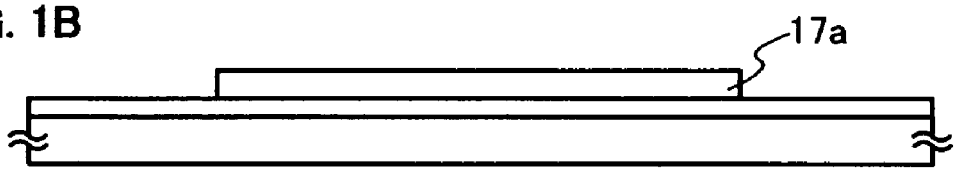

Next, patterning is performed with the use of a photolithography technique to obtain a semiconductor film 17a (FIG. 1B). Before forming a resist mask in the patterning, an oxide film is formed by using solution containing ozone or generating ozone by UV irradiation in an oxygen atmosphere to form an oxide film in order to protect the semiconductor film. The oxide film here is also effective in improving wettability of the resist.

If necessary, before the patterning, doping with a slight amount of impurity element (boron or phosphorous) is performed through the oxide film described above in order to control the threshold voltage of a TFT. When the doping is performed though the oxide film described above, the oxide film is removed, and another oxide film is formed by using a solution containing ozone.

Figure 1C:
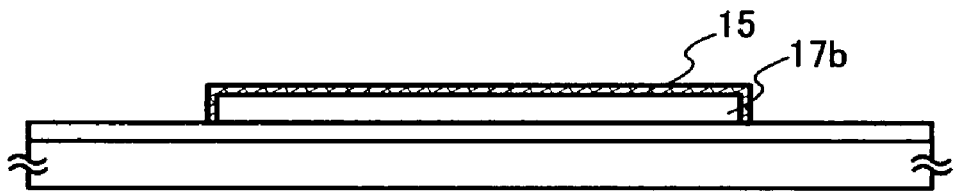

Then, after cleaning is performed for removing undesired substances (for example, resist left and a solution for stripping resist) produced during the patterning, a solution containing ozone (typically, ozone water) is used to form an oxide film (referred to as a chemical oxide) 15 at the surface of the semiconductor film 17b in order to protect the patterned semiconductor film (FIG. 1C).

Figure 1D:
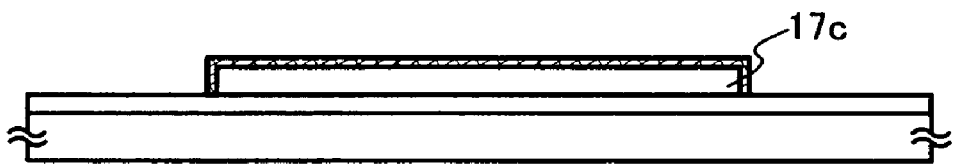

Next, a heat treatment for reducing strain of the semiconductor film (a heat treatment of heating the semiconductor film instantaneously to approximately 400 to 1000° C.) is performed in a nitrogen atmosphere to obtain a flat semiconductor film 17c (FIG. 1D). As the heat treatment of instantaneous heating, a heat treatment of intense light irradiation or a heat treatment of putting the substrate into heated gas and taking the substrate out after being left for several minutes may be used. Depending on the condition of this heat treatment, defects remaining in crystal grains can be repaired, that is, the crystallinity can be improved while reducing the strain.

In the case of performing an instantaneous heat treatment by intense light irradiation, any one of infrared light, visible light, and ultraviolet light or a combination thereof can be used. Typically, light emitted from a halogen lamp, a metal halide lamp, a xenon arc lamp, a carbon arc lamp, a high-pressure sodium vapor lump, or a high-pressure mercury vapor lump is used. The semiconductor film may be heated by turning on the lamp for a required time or instantaneously heated to approximately 400 to 1000° C. by turning on the light source once to ten times, in which each period of turning on the light source may be 10 to 60 seconds, preferably 30 to 60 seconds.

Figure 1E:
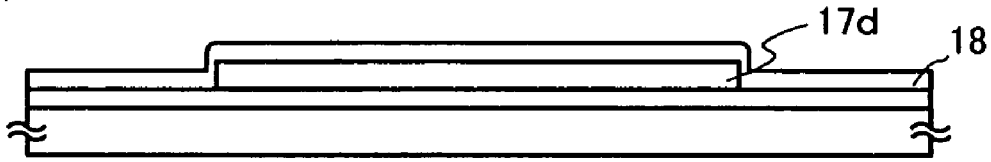

Next, an insulating film containing silicon as its main component to serve as a gate insulating film 18 is formed over the surface of a semiconductor film 17d (FIG. 1E). In order to reduce the number of steps, the gate insulating film 18 is formed without removing the oxide film here. Before forming the gate insulating film 18, the oxide film may be removed by using an etchant including hydrofluoric acid. In addition, it is not particularly necessary to remove the oxide film of the semiconductor film 17d completely, and the oxide film may be left thinly. When the semiconductor film 17d is exposed by overetching, the surface is likely to be contaminated with impurities.

Next, after cleaning the surface of the gate insulating film 18, a gate electrode 19 is formed thereover. Then, the semiconductor film 17d is doped appropriately with an impurity element (for example, P or As) that gives n-type conductivity, phosphorous here, to form a source region 20 and a drain region 21. After the doping, a heat treatment, intense light irradiation, or laser light irradiation is performed in order to activate the impurity element. In addition, as well as activation, plasma damage to the gate insulating film and plasma damage to the interface between the gate insulating film and the semiconductor film can be recovered. In particular, it is quite effective to activate the impurity element by irradiation with the second harmonic of YAG laser from the surface or rear surface side of the semiconductor film in an atmosphere at room temperature to 300° C. The YAG laser is preferable activation means because less maintenance is required.

Figure 1F:
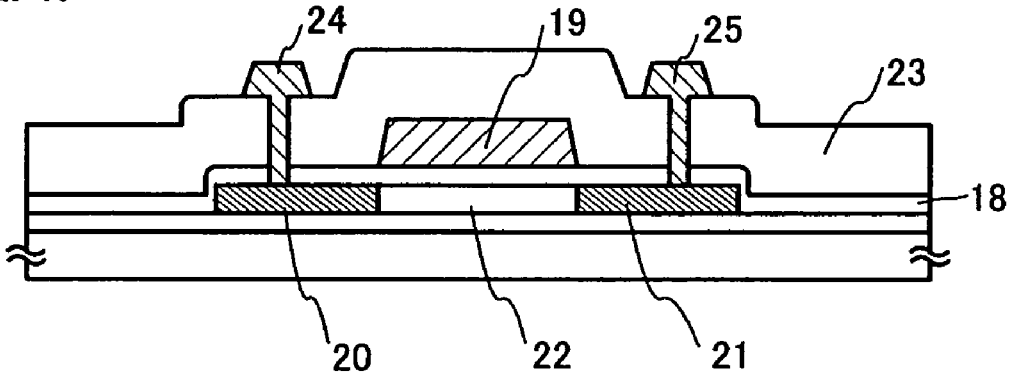

According to subsequent steps of forming an interlayer insulating film 23, performing hydrogenation, forming contact holes reaching the source region 20 and the drain region 21, forming a conductive film, and forming a source electrode 24 and a drain electrode 25 by patterning the conductive film, a TFT (n-channel TFT) is completed (FIG. 1F). The source electrode 24 and the drain electrode 25 are formed by using a single layer comprising an element selected from the group consisting of Mo, Ta, W, Ti, Al, and Cu, or an alloy material or a compound material containing the element as its main component, or by using a lamination layer of these. For example, a three layer structure of a Ti film, a pure-Al film, and a Ti film, or a three layer structure of a Ti film, an Al alloy film containing Ni and C, and a Ti film is used. Further, in consideration of forming an interlayer insulating film and the like in subsequent steps, it is preferable that the cross section of the electrode has a tapered shape.

A channel forming region 22 of the thus obtained TFT is relatively flat, and strain can be reduced.

Further, the present invention is not limited to the TFT structure in FIG. 1F. If necessary, a lightly doped drain (LDD) structure that has an LDD region between a channel forming region and a drain region (or a source region) may be employed. In this structure, a region doped with an impurity element at a lower density is provided between a channel forming region and a source region or a drain region formed by doping with an impurity element at a higher density, and this region is referred to as an LDD region. Further, a so-called GOLD (Gate-drain Overlapped LDD) structure, in which an LDD region is overlapped with a gate electrode with a gate insulating film interposed therebetween, may be employed.

The description is given with reference to an n-channel TFT here. However, it will be obvious that a p-channel TFT can be formed by using a p-type impurity element instead of an n-type impurity element.

In addition, the description is given with reference to a top gate TFT as an example here. The present invention can be applied regardless of the TFT structure, and can be applied to for example, a bottom gate TFT (an inversely staggered TFT) and a staggered TFT.

Embodiment Mode 2

Further, FIGS. 2A to 2I show an example of performing a heat treatment for reducing strain and an oxidation treatment with a solution containing ozone after crystallization of a semiconductor film added with a metal element.

Figure 2A:
FIGS. 2A to 2I are diagrams illustrating a manufacturing process according to the present invention (Embodiment Mode 2)

In FIG. 2A, reference numeral 110 denotes a substrate that has an insulating surface, reference numeral 111 denotes a base insulating film, and reference numeral 112 denotes a semiconductor film including an amorphous structure.

First, as shown in FIG. 2A, the base insulating film 111 comprising an insulating film such as a silicon oxide film, a silicon nitride film, or a silicon oxynitride film ($SiO_xN_y$) is formed on the substrate 110.

Next, the first semiconductor film 112 with the amorphous structure is formed on the base insulating film 111. For the first semiconductor film 112, a semiconductor material containing silicon as its main component is used. Typically, an amorphous silicon film, an amorphous silicon-germanium film, or the like is applied, which is formed by plasma CVD, low-pressure CVD, or sputtering to be 10 to 100 nm in thickness. In order to obtain a semiconductor film including a high-quality crystalline structure in subsequent crystallization, the density of impurities such as oxygen and nitrogen contained in the first semiconductor film 112 with the amorphous structure is preferably reduced to $5 \times 10^{18}/cm^3$ (an atomic density measured by secondary ion mass spectrometry (SIMS)) or less. These impurities become factors for interfering with subsequent crystallization, and factors for increasing density of trapping centers and recombination centers also after crystallization. Therefore, as well as using a high-purity material gas, it is preferable to perform mirror polishing such as electrolytic polishing or use a CVD system equipped with an oil-free vacuum evacuation system, by which super high vacuum can be obtained.

Figure 2B:
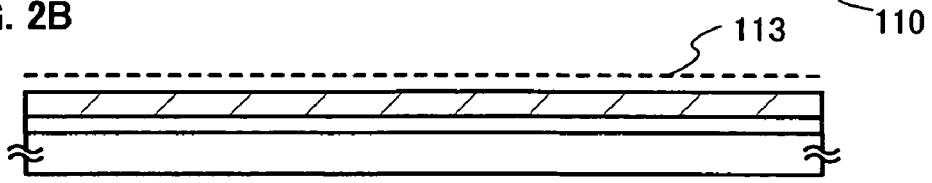

Next, as a technique for crystallizing the first semiconductor film 112 with the amorphous structure, the technique described in Japanese Patent Laid-Open No. 8-78329 is used here for crystallization. In the technique described there, a metal element for promoting crystallization is selectively added to an amorphous silicon film, and a semiconductor film including a crystalline structure that spreads from the region to which the metal element is added is formed by performing a heat treatment. First, a nickel acetate solution including a metal element (nickel here) that has catalytic activity of promoting crystallization at 1 to 100 ppm by weight is applied with a spinner to the surface of the first semiconductor film 112 including the amorphous structure to form a layer containing nickel 113 (FIG. 2B). As another method other than the method of forming a layer containing nickel 113 by application of a solution including a metal element, a method of forming an extremely thin film by sputtering, an evaporation method, or a plasma treatment may be employed. Although an example of application all over the first semiconductor film 112 is shown here, a mask may be formed to form a layer containing nickel selectively.

Figure 2C:
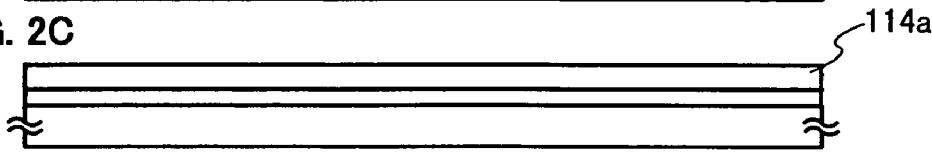

Next, a heat treatment is performed for crystallization. In this case, crystallization proceeds with silicide formed as a nucleus at a portion of the semiconductor film in contact with the metal element which promotes crystallization of a semiconductor. In this way, a first semiconductor film 114a including a crystalline structure, shown in FIG. 2C, is formed. Note that it is preferable that the density of oxygen included in the first semiconductor film 114a after crystallization is made to be $5 \times 10^{18}$ atoms/cm$^3$ or less. After a heat treatment (450° C. for 1 hour) for dehydrogenation, a heat treatment (550 to 650° C. for 2 to 24 hours) for crystallization is performed here. In the case of performing crystallization by intense light irradiation, any one of infrared light, visible light, and ultraviolet light, or a combination thereof can be used. If necessary, before intense light irradiation, a heat treatment may be performed for releasing hydrogen contained in the first semiconductor film 112 including the amorphous structure. Alternatively, a heat treatment and intense light irradiation may be performed at the same time for crystallization. In light of productivity, it is preferable to perform crystallization by intense light irradiation.

In the thus obtained first semiconductor film 114a, the metal element (nickel here) is remaining at a density over $1 \times 10^{19}$ atoms/cm$^3$ as an average density even if the metal element is not distributed uniformly in the film. Of course, even in this state, various semiconductor elements typified by a TFT can be formed. However, the metal element is removed by gettering described subsequently.

Before performing laser light irradiation, a native oxide film formed in the crystallization step is removed here. Because this native oxide film includes nickel at a high density, it is preferable to remove the native oxide film.

Figure 2D:

Next, in order to increase degree of crystallinity (ratio of a volume of crystalline part to the whole volume of the film) and repair defects remaining in crystal grains, the first semiconductor film 114a including the crystalline structure is irradiated with laser light (FIG. 2D). Thus, a first semiconductor film 114b is formed. By laser light irradiation, the semiconductor film 114b has strain and ridges formed, and a thin surface oxide film (not shown) is formed at the surface of the semiconductor film 114b. As this laser light, excimer laser light with a wavelength of 400 nm or less emitted from a pulse oscillating laser or the second or third harmonic of a YAG laser may be used. Alternatively, as the laser light, the second to fourth harmonics of the fundamental wave of a continuous wave solid laser may be used. Typically, the second harmonic (532 nm) or the third harmonic (355 nm) of Nd:YVO$_4$ laser (fundamental wave: 1064 nm) may be applied.

Figure 2E:
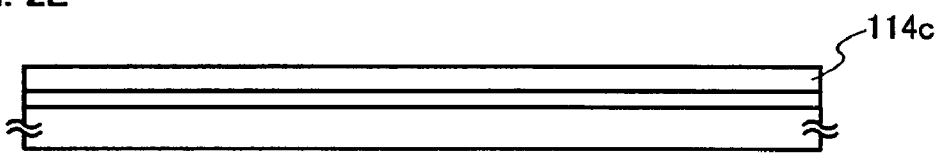

Next, a heat treatment for reducing strain of the first semiconductor film 114b (heating the semiconductor film instantaneously to approximately 400 to 1000° C.) is performed in a nitrogen atmosphere to obtain a flat semiconductor film 114c (FIG. 2E). As the heat treatment of instantaneous heating, intense light irradiation or a treatment of putting a substrate into heated gas and taking the substrate out after being left for several minutes may be used. Depending on the condition of this heat treatment, a defect remaining in a crystal grain can be repaired, that is, the crystallinity can be improved while reducing the strain. In addition, this heat treatment reduces strain so that nickel is easily gettered in a subsequent gettering step. When the temperature in this heat treatment is lower than the melting point of the semiconductor, nickel would move into a silicon film with the first semiconductor film 114c in a solid phase.

Figure 2F:
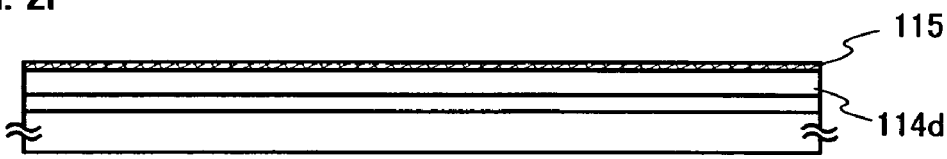

Next, at a surface of a semiconductor film 114d, an oxide film (also referred to as a barrier layer) 115 to serve as an etching stopper is formed by using a solution containing ozone (typically, ozone water) to have a film thickness of 1 to 10 nm (FIG. 2F). Since this oxide film 115 is formed by oxidizing the semiconductor film 114c reduced in strain, the oxide film also has favorable characteristics (for example, flatness and uniformity in film thickness).

Figure 2G:
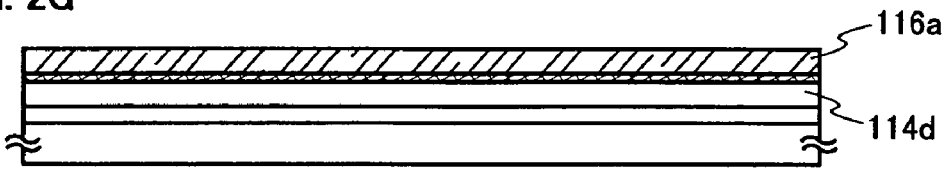

Next, a second semiconductor film 116a including a rare gas element is formed on this oxide film 115 (FIG. 2G).

The second semiconductor film 116a including the rare gas element, which is formed on the oxide film (barrier layer) 115, is formed by plasma CVD or sputtering to form a gettering site of 10 to 300 nm in film thickness. It is preferable that the film thickness of the second semiconductor film 116a is thin since the deposition time and subsequent etching time both can be shortened. As the rare gas element, one or more kinds selected from the group consisting of helium (He), neon (Ne), argon (Ar), krypton (Kr), and xenon (Xe) are used. Above all, argon (Ar) that is an inexpensive gas is preferable.

Plasma CVD is used here to form the second semiconductor film 116a with the use of monosilane and argon as a material gas at the ratio (monosilane:argon) of 0.1:99.9 to 1:9, preferably 1:99 to 5:95. It is preferable that the RF power density during the deposition is controlled to be 0.0017 to 0.48 W/cm$^2$. It is preferable that the RF power density is as high as possible since the quality of the film is improved enough to obtain a gettering effect and the deposition rate is improved. In addition, it is preferable that the pressure during the deposition is controlled to be 1.333 Pa (0.01 Torr) to 133.322 Pa (1 Torr). It is preferable that the pressure is as high as possible since the deposition rate is improved. Further, it is preferable that the deposition temperature is controlled to be 300 to 500° C. In this way, the second semiconductor film 116a can be formed by plasma CVD, which includes argon at a density of $1\times10^{18}$ to $1\times10^{22}$ atoms/cm$^3$, preferably $1\times10^{20}$ to $1\times10^{21}$ atoms/cm$^3$, and with which a gettering effect can be obtained. By controlling the deposition condition for the second semiconductor film within the ranges described above, damage to the oxide film (barrier layer) 115 during the deposition can be reduced so that variation in film thickness of the first semiconductor film and defects of holes formed in the first semiconductor film can be suppressed.

The inclusion of ions of a rare gas element that is an inert gas in the film has two meanings. One is that a dangling bond is formed to give strain to the semiconductor film, and the other is that strain is given among lattices of the semiconductor film. In order to give strain among the lattices of the semiconductor film, it is remarkably effective to use an element that has a larger atomic radius than silicon, such as argon (Ar), krypton (Kr), or xenon (Xe). In addition, the inclusion of the rare gas element in the film forms not only lattice strain but also an unpaired electron to contribute to a gettering action.

Figure 2H:

Next, a heat treatment is performed for gettering in order to reduce the density of the metal element (nickel) in the first semiconductor film or to remove the metal element (FIG. 2H). As the heat treatment for gettering, a heat treatment of intense light irradiation, a heat treatment using a furnace, or a heat treatment of putting a substrate into heated gas and taking the substrate out after being left for several minutes may be used. This gettering makes the metal element move in the direction of arrows in FIG. 2H (that is, the direction from the substrate side toward the surface of the second semiconductor film) to remove the metal element included in a first semiconductor film 114e covered with the oxide film 115 or reduce the density of the metal element. The moving distance of the metal element in the gettering may be a distance almost as long as the thickness of the first semiconductor film, and gettering can be completed for a relatively short time. The nickel is all moved into a second semiconductor film 116b here so as to prevent segregation to perform adequate gettering such that there is almost no nickel included in the first semiconductor film 114e, that is, the nickel density in the film is $1\times10^{18}$ atoms/cm$^3$ or less, preferably $1\times10^{17}$ atoms/cm$^3$ or less. Note that the oxide film 115 also functions as a gettering site in addition to the second semiconductor film.

Next, with the oxide film 115 as an etching stopper, only the second semiconductor film 116b is selectively removed. As a method for etching only the second semiconductor film 116b selectively, dry etching with ClF$_3$ without the use of plasma or wet etching with an alkali solution such as a solution including hydrazine or tetramethyl ammonium hydroxide (chemical formula: (CH$_3$)$_4$NOH; abbreviation: TMAH) can be employed. In the etching here, overetching takes less time in order to prevent a pin hole from being formed in the first semiconductor film. According to measurement of the nickel density at the surface of the oxide film (barrier layer) 115 by TXRF after removing the second semiconductor film 116b, nickel is detected in concentrated amounts. Therefore, it is preferable to remove the oxide film (barrier layer) 115 in a subsequent step.

Next, the oxide film 115 is removed by using an etchant including hydrofluoric acid.

Figure 2I:
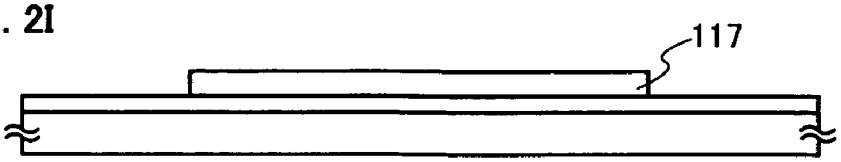

Next, the first semiconductor film 114e is subjected to patterning with the use of a known patterning technique to form a semiconductor film 117 in a desired shape (FIG. 2I).

After removing the oxide film (barrier layer) 115, it is preferable to form a thin oxide film at the surface of the first semiconductor film 114e by using ozone water before forming a mask comprising resist.

If necessary, before the patterning, doping with a slight amount of impurity element (boron or phosphorous) is performed through the oxide film described above in order to control the threshold voltage of a TFT. When the doping is performed though the oxide film described above, the oxide film is removed, and another oxide film is formed by using a solution containing ozone.

After completing the step of forming the semiconductor film 117 in the desired shape, the surface of the semiconductor film 117 is cleaned with the use of an etchant including hydrofluoric acid, and an insulating film containing silicon as its main component is formed to serve as a gate insulating film. It is preferable to clean the surface and form the gate insulating film continuously without exposing to the air. In order to reduce the number of steps, this surface cleaning step may be omitted to form the gate insulating film and a conductive film (a gate electrode material) continuously.

The subsequent steps are the same as those of Embodiment Mode 1. Therefore, the detailed description thereof is omitted here.

Embodiment Mode 3

FIGS. 3A to 3J show here an example of performing a heat treatment more than once. The steps in FIGS. 3A to 3F are the same as the steps in FIGS. 2A to 2F. Therefore, the detailed description thereof is omitted here.

Figure 3A:
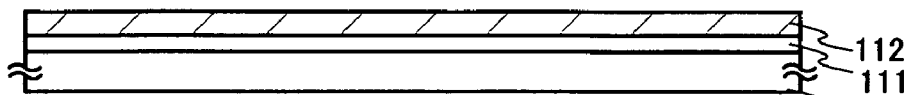
FIGS. 3A to 3J are diagrams illustrating a manufacturing process according to the present invention (Embodiment Mode 3)
Figure 3B:
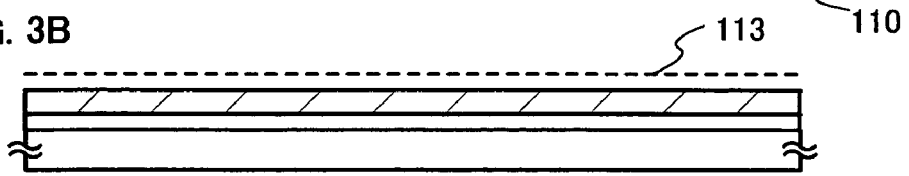
Figure 3C:
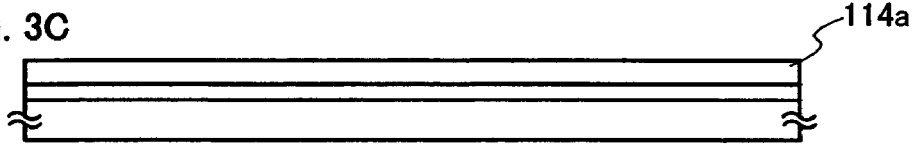
Figure 3D:
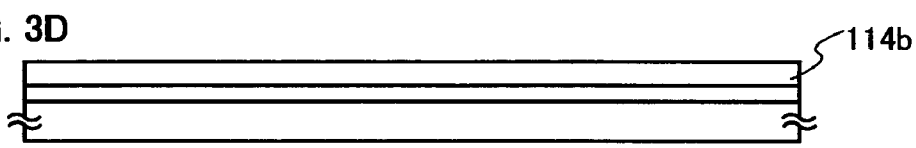
Figure 3E:
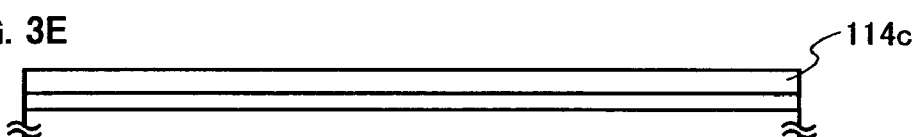
Figure 3F:
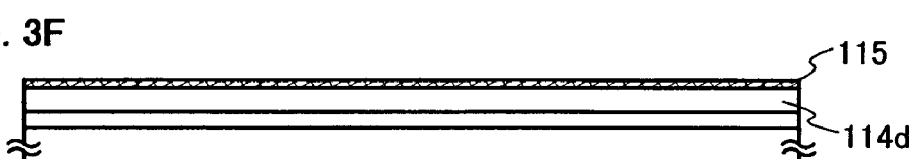
Figure 3G:
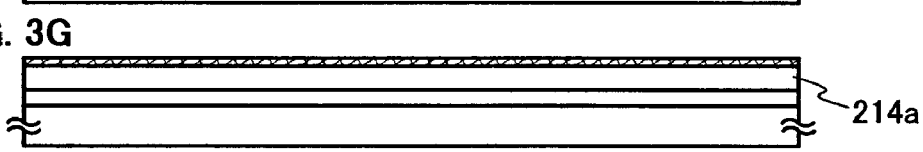

After performing the steps of FIGS. 3A to 3F in accordance with Embodiment Mode 2, the heat treatment for reducing strain of the first semiconductor film is again performed in a nitrogen atmosphere to obtain a flatter first semiconductor film 214a (FIG. 3G). In addition, the oxide film (barrier layer) 115 also becomes denser by the heat treatment.

Figure 3H:
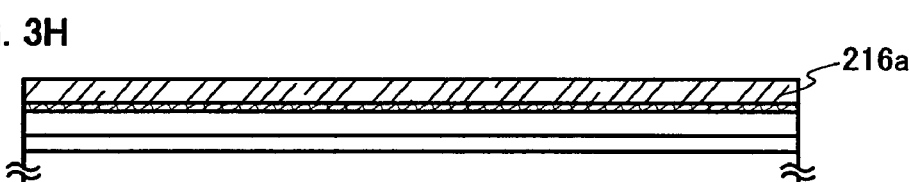

Next, a second semiconductor film 216a including a rare gas element is formed on the oxide film (barrier layer) 115 (FIG. 3H). The second semiconductor film 216a including the rare gas element is formed by plasma CVD or sputtering to form a gettering site of 10 to 300 nm in film thickness.

Figure 3I:
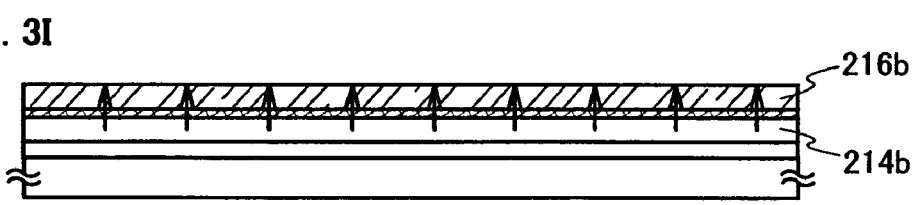

Next, a heat treatment is performed to perform geuering for reducing the density of the metal element (nickel) in the first semiconductor film or removing the metal element (FIG. 3I). As the heat treatment for gettering, a heat treatment of intense light irradiation, a heat treatment using a furnace, or a heat treatment of putting a substrate into heated gas and taking the substrate out after being left for several minutes may be used. This gettering makes the metal element move in the direction of arrows in FIG. 3I (that is, the direction from the substrate side toward the surface of the second semiconductor film) to remove the metal element included in a first semiconductor film 214b covered with the oxide film (barrier layer) 115 or reduce the density of the metal element.

Next, with the oxide film (barrier layer) 115 as an etching stopper, only a second semiconductor film denoted by reference numeral 216b is selectively removed. Then, the oxide film (barrier layer) 115 is removed.

Figure 3J:
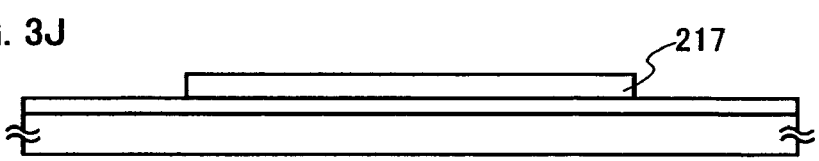

Next, the first semiconductor film 214b is subjected to patterning with the use of a known patterning technique to form a semiconductor film 217 in a desired shape (FIG. 3J). After removing the oxide film (barrier layer) 115, it is preferable to form a thin oxide film at the surface of the first semiconductor film 214b by using ozone water before forming a mask comprising resist.

If necessary, before the patterning, doping with a slight amount of impurity element (boron or phosphorous) is performed through the oxide film described above in order to control the threshold voltage of a TFT. When the doping is performed though the oxide film described above, the oxide film is removed, and an oxide film is again formed by using a solution containing ozone.

After completing the step of forming the semiconductor film 217 in the desired shape, the surface of the semiconductor film 217 is cleaned with the use of an etchant including hydrofluoric acid, and an insulating film containing silicon as its main component is formed to serve as a gate insulating film. It is preferable to clean the surface and form the gate insulating film continuously without exposing to the air.

The subsequent steps are the same as those of Embodiment Mode 1. Therefore, the detailed description thereof is omitted here.

Embodiment Mode 4

FIGS. 4A to 4J show here an example of performing gettering after patterning of a semiconductor film. The steps in FIGS. 4A to 4F are the same as the steps in FIGS. 2A to 2D. Therefore, the detailed description thereof is omitted here.

Figure 4A:
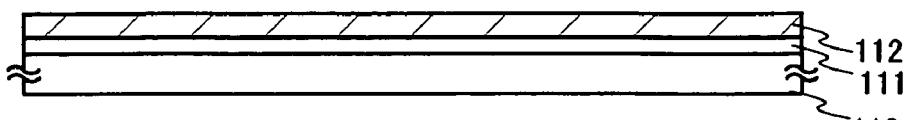
FIGS. 4A to 4J are diagrams illustrating a manufacturing process according to the present invention (Embodiment Mode 4)
Figure 4B:
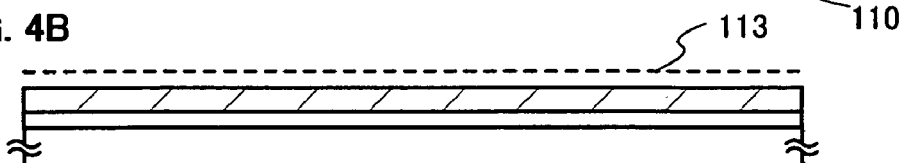
Figure 4C:
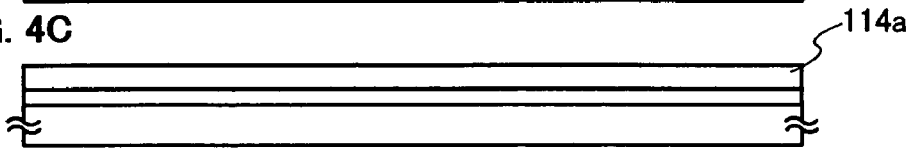
Figure 4D:
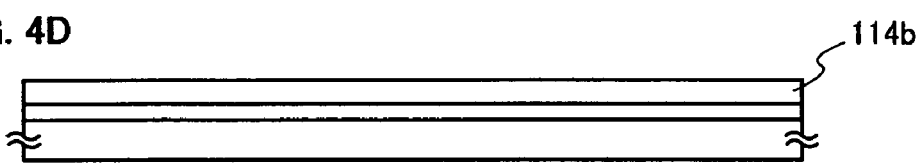
Figure 4E:
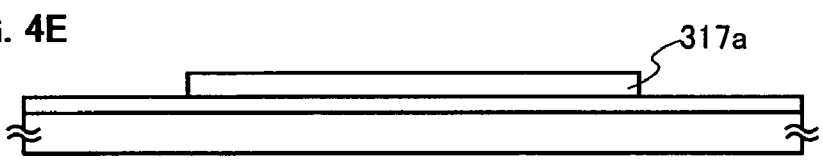

After performing the steps of FIGS. 4A to 4D in accordance with Embodiment Mode 2, the first semiconductor film 114b is subjected to patterning with the use of a known patterning technique to form a semiconductor film 317a in a desired shape (FIG. 4E). It is preferable to form a thin oxide film at the surface of the first semiconductor film 114b by using ozone water before forming a mask comprising resist.

If necessary, before the patterning, doping with a slight amount of impurity element (boron or phosphorous) is performed through the oxide film described above in order to control the threshold voltage of a TFT. When the doping is performed though the oxide film described above, the oxide film is removed, and another oxide film is again formed by using a solution containing ozone.

Figure 4F:
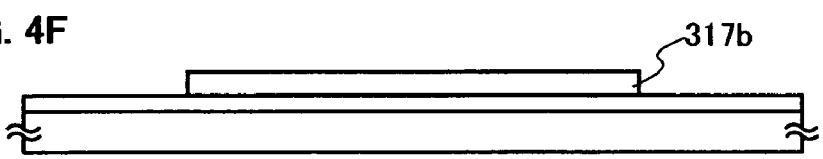

Next, a heat treatment for reducing strain of the semiconductor film (a heat treatment of heating the semiconductor film instantaneously to approximately 400 to 1000° C.) is performed in a nitrogen atmosphere to obtain a flat semiconductor film 317b (FIG. 4F). Depending on the condition of this heat treatment, a defect remaining in a crystal grain can be repaired, that is, the crystallinity can be improved while reducing the strain.

Figure 4G:

Next, at the surface of the semiconductor film 317b, an oxide film (also referred to as a barrier layer) 315 to serve as an etching stopper is formed by using a solution containing ozone to have a film thickness of 1 to 10 nm (FIG. 4G). Since the oxide film 315 is formed by oxidizing the semiconductor film 317b reduced in strain, the oxide film also has favorable characteristics (for example, flatness and uniformity in film thickness). In addition, the formation of the oxide film makes it possible to keep an interface of the semiconductor film 317b further stable.

Figure 4H:
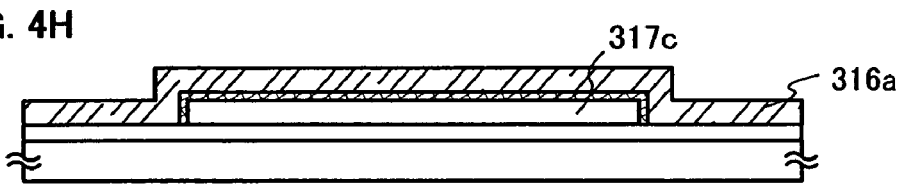

Next, a second semiconductor film 316a including a rare gas element is formed on this oxide film 315 (FIG. 4H).

Figure 4I:
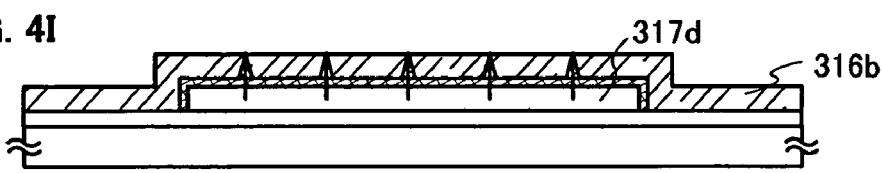
Figure 4J:
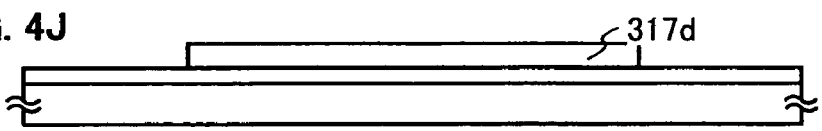

Next, a heat treatment is performed for gettering in order to reduce the density of the metal element (nickel) in the first semiconductor film or to remove the metal element (FIG. 4I). As the heat treatment for gettering, a heat treatment of intense light irradiation, a heat treatment using a furnace, or a heat treatment of putting a substrate into heated gas and taking the substrate out after being left for several minutes may be used. This gettering makes the metal element move in the direction of arrows in FIG. 4I (that is, the direction from the substrate side toward the surface of the second semiconductor film) to remove the metal element included in a first semiconductor film 317d covered with the oxide film 315 or reduce the density of the metal element.

Next, with the use of the barrier layer 315 as an etching stopper, only a second semiconductor film denoted by reference numeral 316b is selectively removed. Then, the oxide film 315 is removed.

Next, an insulating film containing silicon as its main component is formed to serve as a gate insulating film.

The subsequent steps are the same as those of Embodiment Mode 1. Therefore, the detailed description thereof is omitted here.

Embodiment Mode 5

FIGS. 5A to 5J show here an example of performing a heat treatment more than once after patterning of a semiconductor film, and then performing gettering. The steps in FIGS. 5A to 5F are the same as the steps in FIGS. 2A to 2D. Therefore, the detailed description thereof is omitted here.

Figure 5A:
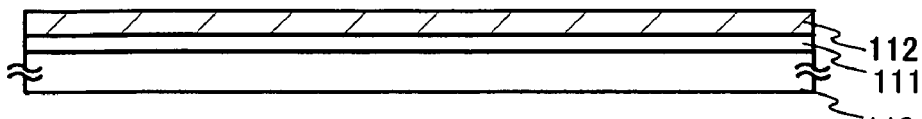
FIGS. 5A to 5J are diagrams illustrating a manufacturing process according to the present invention (Embodiment Mode 5)
Figure 5B:
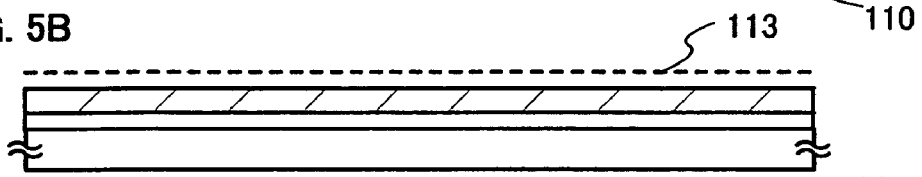
Figure 5C:
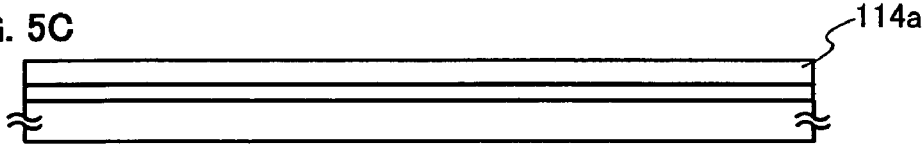
Figure 5D:
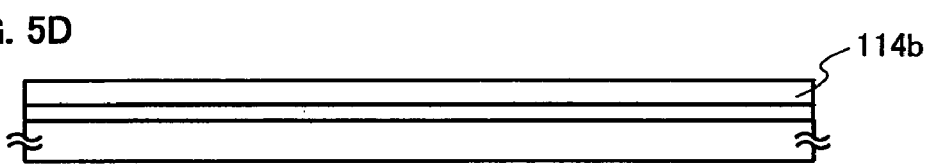
Figure 5E:
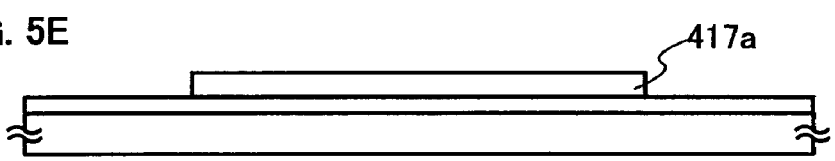

After performing the steps of FIGS. 5A to 5D in accordance with Embodiment Mode 2, the first semiconductor film 114b is subjected to patterning with the use of a known patterning technique to form a semiconductor film 417a in a desired shape (FIG. 5E). It is preferable to form a thin oxide film at the surface of the first semiconductor film 114b by using ozone water before forming a mask comprising resist.

If necessary, before the patterning, doping with a slight amount of impurity element (boron or phosphorous) is performed through the oxide film described above in order to control the threshold voltage of a TFT. When the doping is performed though the oxide film described above, the oxide film is removed, and another oxide film is formed by using a solution containing ozone.

Figure 5F:
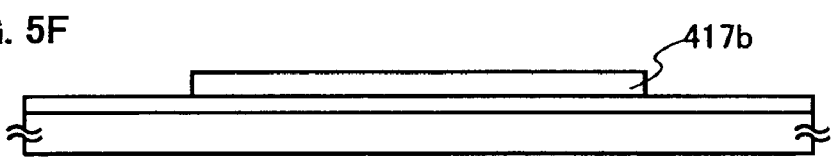

Next, a heat treatment for reducing strain of the semiconductor film (a heat treatment of heating the semiconductor film instantaneously to approximately 400 to 1000° C.) is performed in a nitrogen atmosphere to obtain a flat semiconductor film 417b (FIG. 5F).

Figure 5G:
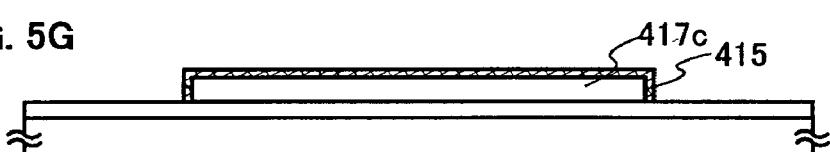

Next, at the surface of a semiconductor film 417c, an oxide film (also referred to as a barrier layer) 415 to serve as an etching stopper is formed by using a solution containing ozone to have a film thickness of 1 to 10 nm (FIG. 5G).

Figure 5H:
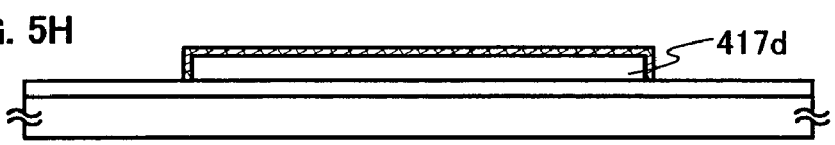

Next, the heat treatment for reducing strain of the semiconductor film is again performed in a nitrogen atmosphere to obtain a flatter semiconductor film 417d (FIG. 5H). In addition, the oxide film 415 also becomes denser by the heat treatment.

Figure 5I:
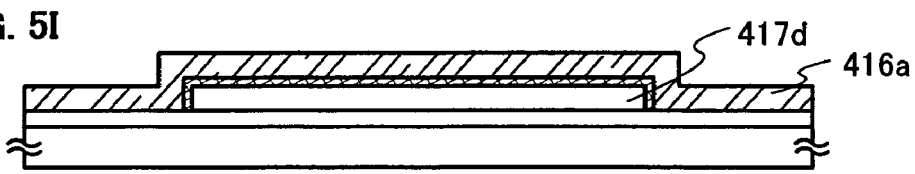

Next, a second semiconductor film 416a including a rare gas element is formed on this oxide film 415 (FIG. 5I).

Figure 5J:
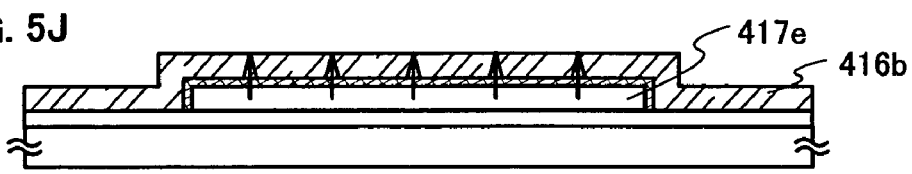

Next, a heat treatment is performed for gettering in order to reduce the density of the metal element (nickel) in the first semiconductor film or to remove the metal element (FIG. 5J). As the heat treatment for gettering, a heat treatment of intense light irradiation, a heat treatment using a furnace, or a heat treatment of putting a substrate into heated gas and taking the substrate out after being left for several minutes may be used. This gettering makes the metal element move in the direction of arrows in FIG. 5J (that is, the direction from the substrate side toward the surface of the second semiconductor film) to remove the metal element included in a first semiconductor film 417e covered with the oxide film 415 or reduce the density of the metal element.

Next, with the oxide film 415 as an etching stopper, only a second semiconductor film denoted by reference numeral 416b is selectively removed. Then, the oxide film 415 is removed.

Next, an insulating film containing silicon as its main component is formed to serve as a gate insulating film.

The subsequent steps are the same as those of Embodiment Mode 1. Therefore, the detailed description thereof is omitted here.

Embodiment Mode 6

FIGS. 6A to 6I show here an example that is partially different in step sequence from Embodiment Mode 2, specifically an example of performing a heat treatment for reducing strain after an oxidation treatment. The steps in FIGS. 6A to 6D are the same as the steps in FIGS. 2A to 2D. Therefore, the detailed description thereof is omitted here.

Figure 6A:
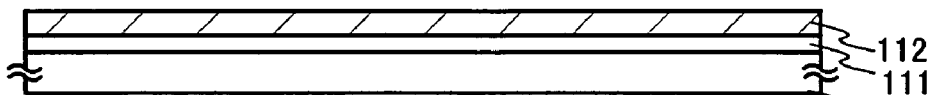
FIGS. 6A to 6I are diagrams illustrating a manufacturing process according to the present invention (Embodiment Mode 6)
Figure 6B:
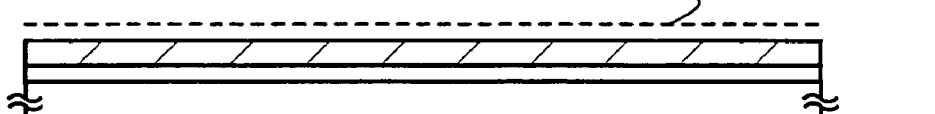
Figure 6C:
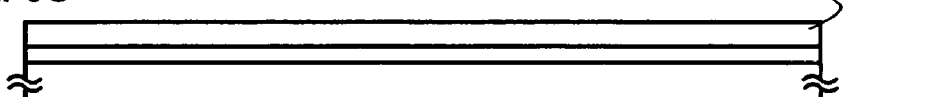
Figure 6D:
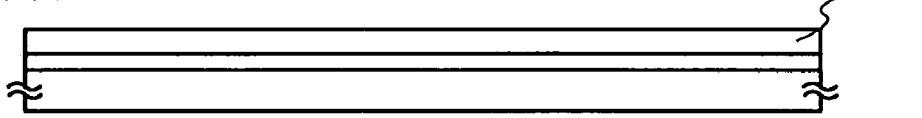
Figure 6E:
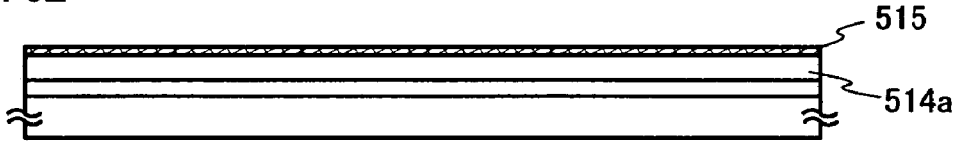

After performing the steps of FIGS. 6A to 6D in accordance with Embodiment Mode 2, at the surface of a semiconductor film 514a, an oxide film (also referred to as a barrier layer) 515 to serve as an etching stopper is formed by using a solution containing ozone to have a film thickness of 1 to 10 nm (FIG. 6E).

Before forming the oxide film 515 by using the solution containing ozone, a surface oxide film formed by laser light irradiation may be removed.

Figure 6F:
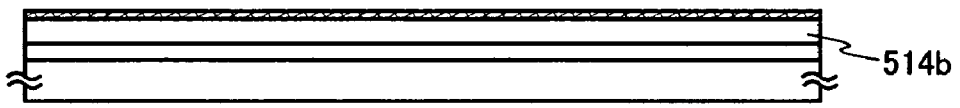

Next, a heat treatment for reducing strain of the semiconductor film (a heat treatment of heating the semiconductor film instantaneously to approximately 400 to 1000° C.) is performed in a nitrogen atmosphere to obtain a semiconductor film 514b (FIG. 6F).

Figure 6G:
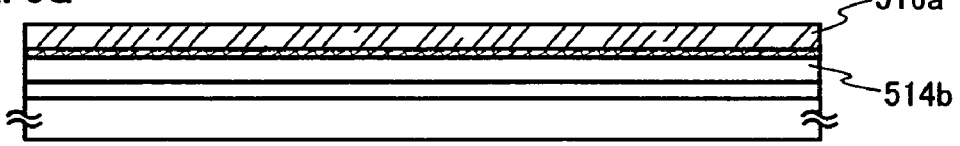

Next, a second semiconductor film 516a including a rare gas element is formed on this oxide film 515 (FIG. 6G).

Figure 6H:

Next, a heat treatment is performed for gettering in order to reduce the density of the metal element (nickel) in the first semiconductor film or removing the metal element (FIG. 6H). As the heat treatment for gettering, a heat treatment of intense light irradiation, a heat treatment using a furnace, or a heat treatment of putting a substrate into heated gas and taking the substrate out after being left for several minutes may be used. This gettering makes the metal element move in the direction of arrows in FIG. 6H (that is, the direction from the substrate side toward the surface of the second semiconductor film) to remove the metal element included in a first semiconductor film 514c covered with the oxide film 515 or reduce the density of the metal element.

Next, with the oxide film 515 as an etching stopper, only a second semiconductor film denoted by reference numeral 516b is selectively removed. Then, the oxide film 515 is removed.

Figure 6I:
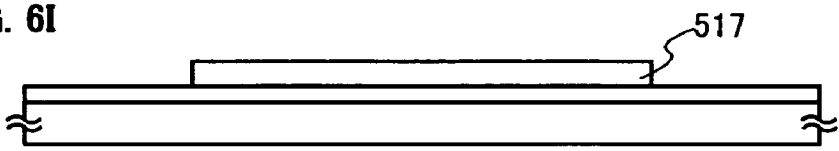

Next, the first semiconductor film 514c is subjected to patterning with the use of a known patterning technique to form a semiconductor film 517 in a desired shape (FIG. 6I). After removing the oxide film 515, it is preferable to form a thin oxide film at the surface of the first semiconductor film 514c by using ozone water before forming a mask comprising resist.

If necessary, before the patterning, doping with a slight amount of impurity element (boron or phosphorous) is performed through the oxide film described above in order to control the threshold voltage of a TFT. When the doping is performed though the oxide film described above, the oxide film is removed, and another oxide film is formed by using a solution containing ozone.

After completing the step of forming the semiconductor film 517 in the desired shape, the surface of the semiconductor film 517 is cleaned with the use of an etchant including hydrofluoric acid, and an insulating film containing silicon as its main component is formed to serve as a gate insulating film. It is preferable to clean the surface and form the gate insulating film continuously without exposing to the air.

The subsequent steps are the same as those of Embodiment Mode 1. Therefore, the detailed description thereof is omitted here.

Embodiment Mode 7

FIGS. 7A to 7J show here an example that is partially different in step sequence from Embodiment Mode 4, specifically an example of performing a heat treatment for reducing strain after an oxidation treatment. The steps in FIGS. 7A to 7D are the same as the steps in FIGS. 2A to 2D. Therefore, the detailed description thereof is omitted here.

Figure 7A:
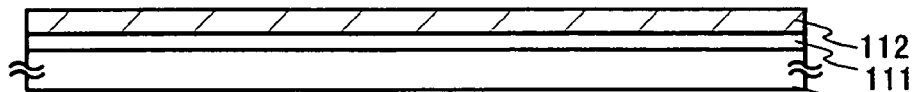
FIGS. 7A to 7J are diagrams illustrating a manufacturing process according to the present invention (Embodiment Mode 7)
Figure 7B:
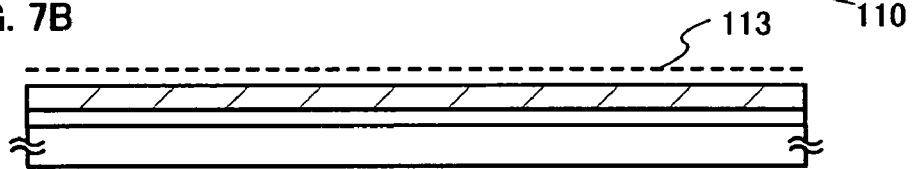
Figure 7C:
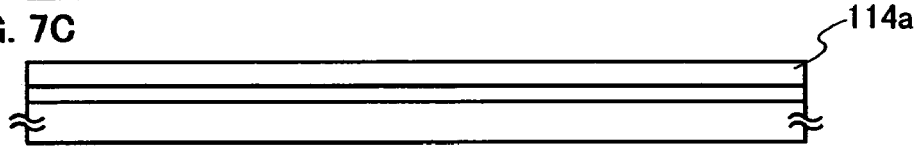
Figure 7D:
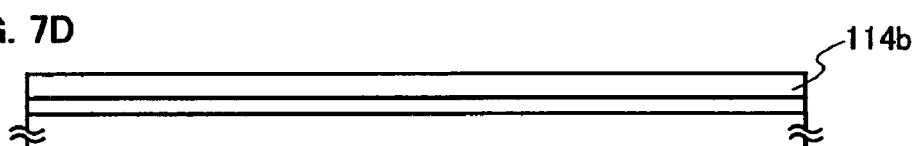
Figure 7E:
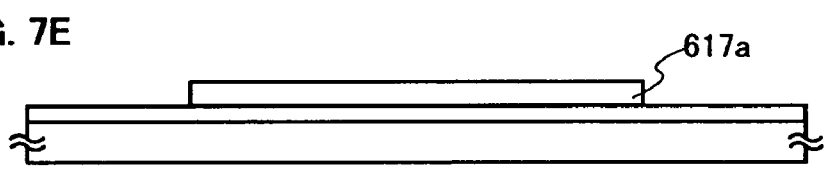

After performing the steps of FIGS. 6A to 6D in accordance with Embodiment Mode 2, the first semiconductor film 114b is subjected to patterning with the use of a known patterning technique to form a semiconductor film 617a in a desired shape (FIG. 7E). It is preferable to form a thin oxide film at the surface of the first semiconductor film 114b by using ozone water before forming a mask comprising a resist.

If necessary, before the patterning, doping with a slight amount of impurity element (boron or phosphorous) is performed through the oxide film described above in order to control the threshold voltage of a TFT. When the doping is performed through the oxide film described above, the oxide film is removed, and another oxide film is formed by using a solution containing ozone.

Figure 7F:

Next, at the surface of a semiconductor film 617b, an oxide film (also referred to as a barrier layer) 615 to serve as an etching stopper is formed by using a solution containing ozone to have a film thickness of 1 to 10 nm (FIG. 7F).

Figure 7G:
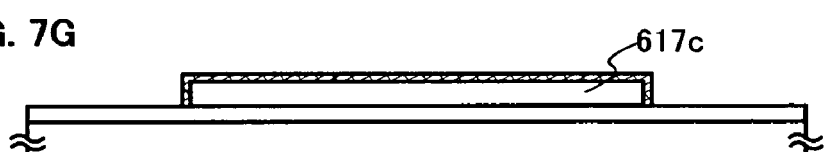

Next, a heat treatment for reducing strain of the semiconductor film (a heat treatment of heating the semiconductor film instantaneously to approximately 400 to 1000° C.) is performed in a nitrogen atmosphere to obtain a semiconductor film 617c (FIG. 7G).

Figure 7H:
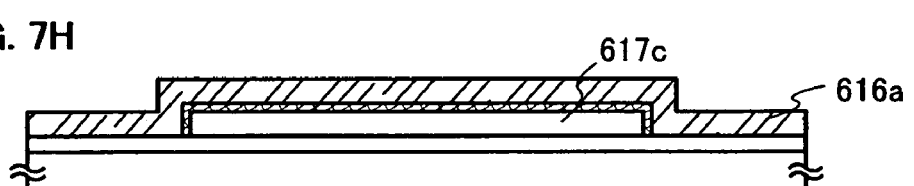

Next, a second semiconductor film 616a including a rare gas element is formed on this oxide film 615 (FIG. 7H).

Figure 7I:
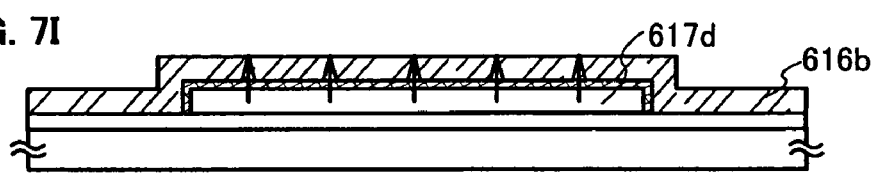
Figure 7J:
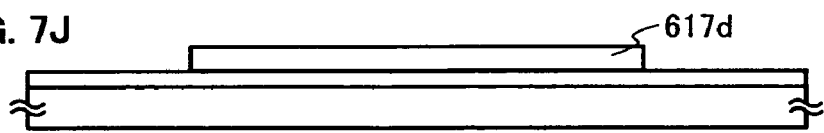

Next, a heat treatment is performed for gettering in order to reduce the density of the metal element (nickel) in the first semiconductor film or remove the metal element (FIG. 7I). As the heat treatment for gettering, a heat treatment of intense light irradiation, a heat treatment using a furnace, or a heat treatment of putting a substrate into heated gas and taking the substrate out after being left for several minutes may be used. This gettering makes the metal element move in the direction of arrows in FIG. 7I (that is, the direction from the substrate side toward the surface of the second semiconductor film) to remove the metal element included in a first semiconductor film 617d covered with the oxide film 615 or reduce the density of the metal element.

Next, with the oxide film 615 as an etching stopper, only a second semiconductor film denoted by reference numeral 616b is selectively removed. Then, the oxide film 615 is removed.

Next, an insulating film containing silicon as its main component is formed to serve as a gate insulating film.

The subsequent steps are the same as those of Embodiment Mode 1. Therefore, the detailed description thereof is omitted here.

The present invention described above will be described in more detail in the embodiments below.

Embodiment 1

In the present embodiment, a method for manufacturing a light-emitting device including an EL element (FIGS. 8A and 8B), which is referred to as an organic EL display or an organic light-emitting diode, will be described.

An EL element that has a layer including an organic compound as a light-emitting layer has a structure in which the layer including the organic compound (hereinafter, referred to as an EL layer) is interposed between an anode and a cathode, and luminescence (Electro Luminescence) is obtained from the EL layer by applying an electric field between the anode and the cathode. The luminescence from the EL element includes luminescence (fluorescence) in returning from a singlet excited state to the ground state and luminescence (phosphorescence) in returning from a triplet excited state to the ground state.

First, a base insulating film 811 is formed on a substrate 810. In the case of extracting luminescence from the substrate 810 side as a display side, a light-transmitting glass substrate or a quartz substrate may be used as the substrate 810. Alternatively, a heat-resistant and light-transmitting plastic substrate that can withstand processing temperatures may be used. In the case of extracting luminescence from the display side opposite to the substrate 810 side, a silicon substrate, a metal substrate, or a stainless substrate that has an insulating film at the surface thereof may be used in addition to the substrate described above. Here, a glass substrate is used as the substrate 810. Note that the refractive index of the glass substrate may be about 1.55.

As the base insulating film 811, a base film comprising an insulating film such as a silicon oxide film, a silicon nitride film, or a silicon oxynitride film is formed. Although an example of using a two layer structure for the base film is described here, a single layer film of the insulating film or a laminated structure of more than three layers may be used. The formation of the base insulating film may be omitted.

Next, a semiconductor film is formed on the base insulating film 811. After forming a semiconductor film including an amorphous structure by a known method (for example, sputtering, LPCVD, or plasma CVD), a known crystallization treatment (laser crystallization, thermal crystallization, thermal crystallization using a catalyst such as nickel) is performed to obtain a semiconductor film including a crystalline structure as the semiconductor film on the base insulating film 811. Although the material for the crystalline semiconductor film is not limited, a material such as silicon or silicon-germanium alloy is preferably used for forming the crystalline semiconductor film. In the present embodiment, nickel is used as a metal element for promoting crystallization of silicon, and after a heat treatment (500° C. for 1 hour) for dehydrogenation, a heat treatment (500° C. for 4 hours) for crystallization is performed in a furnace to obtain a silicon film including a crystalline structure. Instead of the furnace, a lamp annealing system may be used.

Next, the crystalline semiconductor film is irradiated with laser light after removing a native oxide film. As a laser oscillator to be used for oscillating the laser light, a laser oscillator capable of emitting ultraviolet light, visible light, or infrared light can be used. Typically, excimer laser light with a wavelength of 400 nm or less or the second or third harmonic of a YAG laser light is used as the laser light. For example, pulsed laser light with a repetition rate of 10 Hz to 100 MHz is used.

Alternatively, a continuous wave laser may be used for laser light irradiation in crystallization of the semiconductor film including the amorphous structure or after crystallization. In order to obtain a crystal that has a large grain size in crystallization of an amorphous semiconductor film, it is preferable to use at least one of the second to fourth harmonics of the fundamental wave of a continuous wave solid laser. Typically, the second harmonic (532 nm) or the third harmonic (355 nm) of Nd:YVO$_4$ laser (fundamental wave: 1064 nm) may be used.

In the present embodiment, the semiconductor film is irradiated with laser light at least once in crystallization or after crystallization. When laser light irradiation is performed, the semiconductor film has strain and ridges formed, and a thin surface oxide film is formed at the surface of the semiconductor film.

Next, a heat treatment for reducing strain of the semiconductor film (a heat treatment of heating the semiconductor film instantaneously to approximately 400 to 1000° C.) is performed in a nitrogen atmosphere. In the present embodiment, the semiconductor film is heated in a furnace at a temperature of 630 to 650° C. for 6 minutes. Instead of the furnace, a lamp annealing system may be used.

Next, the surface of the semiconductor film is treated with ozone water for 120 seconds to form a barrier layer comprising an oxide film having a thickness of 1 to 5 nm in total.

Next, a gettering treatment is performed for reducing nickel in the semiconductor film. An amorphous silicon film including argon to serve as a gettering site is formed by plasma CVD so as to have a thickness of 10 to 400 nm on the oxide film (barrier layer). In the present embodiment, the RF power is controlled to be 300 W, that is, the RF power density is controlled to be 0.052 W/cm$^2$, to be 30 nm in film thickness. In the present embodiment, the gettering treatment is performed since the semiconductor film is crystallized by using nickel. However, in the case of performing crystallization by another crystallization method without the use of nickel, the gettering treatment is unnecessary.

Next, the semiconductor film is heated for 6 minutes in a furnace at a temperature of 650° C. to reduce the nickel density in the semiconductor film including a crystalline structure. Instead of the furnace, a lamp annealing system may be used.

Next, after removing the amorphous silicon film including argon to serve as a gettering site selectively with the use of the oxide film as an etching stopper, the oxide film is removed selectively by using diluted hydrofluoric acid. In gettering, nickel tends to move easily to a region including a higher density of oxygen. Therefore, it is preferable to remove the barrier layer formed of the oxide film after the gettering.

Next, an extremely thin oxide film of about 2 nm is formed at the surface by using ozone water. Then, doping with a slight amount of impurity element (boron or phosphorous) is performed in order to control the threshold voltage of a TFT. In the present embodiment, ion doping by plasma excitation of diborane (B$_2$H$_6$) without mass separation is employed to dope the amorphous silicon film with boron under the doping condition that the acceleration voltage is 15 kV, the flow rate of gas in which diborane is diluted with hydrogen to 1% is 30 sccm, and the dose amount is 2×10$^{12}$ atoms/cm$^2$.

Next, after removing the extremely thin oxide film at the surface of the semiconductor film and forming another thin oxide film at the surface of the semiconductor film by using ozone water, a mask comprising resist is formed over the semiconductor film with the use of a first photomask, and the semiconductor film is etched to form a separated island-shaped semiconductor film having a desired shape. At this stage, the thickness of the semiconductor film is controlled to be 25 to 80 nm (preferably 30 to 70 nm).

Next, after cleaning the surface of the semiconductor film while removing the oxide film by using an etchant including hydrofluoric acid, an insulating film containing silicon as its main component is formed to serve as a gate insulating film 812. A silicon oxynitride film (composition ratio: Si=32%; O=59%, N=7%, and H=2%) is formed here by plasma CVD to be 115 nm in thickness.

Next, a lamination layer of a first conductive film that has a film thickness of 20 to 100 nm and a second conductive film that has a film thickness of 100 to 400 nm is formed on the gate insulating film 812. In the present embodiment, a tantalum nitride film of 50 nm in film thickness and a tungsten film of 370 nm in film thickness on the gate insulating film. As conductive materials for forming the first conductive film and the second conductive film, an element selected from the group consisting of Ta, W, Ti, Mo, Al, and Cu, or an alloy material or a compound material containing one of the elements as its main component is used.

Next, a resist mask is formed with the use of a second photomask, and the first conductive film and the second conductive film are etched by using dry etching or wet etching to obtain conductive layers 814a, 814b, 815a, and 815b. In the present embodiment, ICP etching is used to etch the conductive films one or more times into a desired tapered shape by appropriately controlling the etching condition (for example, the electric power applied to a coiled electrode, the electric power applied to an electrode on the side of the substrate, and the temperature of the electrode on the side of the substrate). As gas for the etching, chlorinated gases typified by Cl$_2$, BCl$_3$, SiCl$_4$, and CCl$_4$, fluorinated gases typified by CF$_4$, SF$_6$, and NF$_3$, and O$_2$ can be used appropriately. The angle of a tapered portion of the conductive layer 814 is controlled to be 15 to 45°, and the angle of a tapered portion of the conductive layer 814b is controlled to be 60 to 89°.

Note that the conductive layers 814a and 814b serve as a gate electrode of a TFT while the conductive layers 815a and 815b serve as a terminal electrode.

Next, after removing the resist mask, another resist mask is newly formed with the use of a third photomask, and a first doping step for doping with a lower density of impurity element that imparts n-type conductivity to a semiconductor (typically, phosphorous or arsenic) is performed in order to form an n-channel TFT (not shown here). The resist mask covers a region for a p-channel TFT and the vicinity of the conductive layers. According to this first doping step, the impurity element is doped through the gate insulating film 812 to form a lower density impurity region. Although one light-emitting element may be driven by using a plurality of TFTs, the doping step described is not particularly necessary in the case of driving a light-emitting element by only p-channel TFTs.

Next, after removing the resist mask, another resist mask is newly formed with the use of a fourth photomask, and a second doping step for doping with a higher density of impurity element that imparts p-type conductivity to a semiconductor (typically, boron) is performed. According to this second doping step, the impurity element is doped through the gate insulating film 812 to form higher density impurity regions 817 and 818.

Next, a resist mask is newly formed with the use of a fifth photomask, and a third doping step for doping with a higher density of impurity element that imparts n-type conductivity to a semiconductor (typically, phosphorous or arsenic) is performed in order to form an n-channel TFT (not shown here). The condition of ion doping in the third doping step has a dose amount of 1×10$^{13}$ to 5×10$^{15}$ atoms/cm$^2$ and an acceleration voltage of 60 to 100 kV. The resist mask covers the region for the p-channel TFT and the vicinity of the conductive layers. According to this third doping step, the impurity element is doped through the gate insulating film 812 to form an n-type higher density impurity region.

Then, after removing the resist mask and forming an insulating film 813 including hydrogen, the impurity element with which the semiconductor film is doped is activated and hydrogenated. As the insulating film 813 including hydrogen, a silicon nitride oxide film (a SiNO film) obtained by plasma CVD is used. In addition, in the case of using a metal element for promoting crystallization, typically nickel, to crystallize the semiconductor film, gettering for reducing nickel in a channel forming region can also be performed at the same time as the activation. The insulating film 813 including hydrogen is a first layer of an interlayer insulating film, and includes silicon oxide.

Next, a highly heat-resistant planarization film 816 is formed to serve as a second layer of the interlayer insulating film. As the highly heat-resistant planarization film 816, an insulating film that has a framework structure comprising a bond of silicon (Si) and oxygen (O), which can be obtained by application, is used. In the present embodiment, a spin coating system equipped with a mechanism for rotating the whole of a coating sup and a mechanism capable of controlling the pressure of the atmosphere in the coating cup, in which a substrate is horizontally put in the coating cup, is used, and by spinning gradually (rotating speed: 0 to 1000 rpm) while dropping a coating material liquid using a fluid material in which a siloxane polymer is dissolved in a solvent (propylene glycol monomethyl ether (molecular formula: $CH_3OCH_2CH(OH)CH_3$)) from a nozzle, the coating material is uniformly spread by centrifugal force. Then, a treatment for removing an edge is performed by using an edge remover provided in the coating system. Then, pre-baking is performed by baking at 110° C. for 170 seconds. Then, after the substrate is carried out of the spin coating system and cooled down, baking at 270° C. for 1 hour is further performed. In this way, the highly heat-resistant planarization film 816 is formed to be 0.8 μm in film thickness.

Depending on the structure of a siloxane, it is possible to be divided into, for example, silica glass, alkylsiloxane polymer, alkyl silses quioxane polymer, hydrogenated silses quioxane polymer, or hydrogenated alkyl silses quioxane polymer. As examples of siloxane polymers, there are coating insulating film materials (SB-K1 and PSB-K31) manufactured by Toray Industries and a coating insulating film material (PSB-K31) manufactured by Catalysts & Chemicals Co., Ltd.

Next, heating at 250 to 410° C. for 1 hour is performed for dehydration of the highly heat-resistant planarization film 816. This heat treatment may be performed also for activation of the impurity element with which the semiconductor film is doped and hydrogenation. In addition, on the highly heat-resistant planarization film 816, a silicon nitride oxide film (SiNO film: 100 to 200 nm in film thickness) that can be obtained by plasma CVD may be formed as a third layer of the interlayer insulating film. When the third interlayer insulating film is formed, it is preferable to remove the third interlayer insulating film selectively with a wiring 822 or first electrode to be formed later.

Next, with the use of a sixth mask, a peripheral portion of the interlayer insulating film 816 is removed while forming a contact hole in the interlayer insulating film 816. Etching (wet etching or dry etching) of the interlayer insulating film 816 is performed here under the condition that etching rate of the insulating film 813 is quite lower than that of the interlayer insulating film 816. Although the gas to be used for the etching is not limited, it is appropriate here to use $CF_4$, $O_2$, He, and Ar.

Next, another etching is performed with the sixth mask to remove an exposed portion of the gate insulating film 812 and the insulating film 813 selectively with the use of $CHF_3$ and Ar as gases for the etching. In order to etch the gate insulating film 812 and the insulating film 813 without leaving residue on the semiconductor film, etching time is preferably increased by a rate of approximately 10 to 20%.

Next, after removing the sixth mask and forming a conductive film (Ti\Al\Ti or Mo\Al\Mo), etching is performed with the use of a seventh mask to form a wiring 822.

Next, first electrodes 823R and 823G, that is, anodes (or cathodes) of organic light-emitting elements are formed with the use of an eighth mask. The first electrodes 823R and 823G are formed of one film or laminated films mainly including a substance of Ti, TiN, $TiSi_xN_y$, Ni, W, $WSi_x$, $WN_x$, $WSi_xN_y$, NbN, Cr, Pt, Zn, Sn, In, or Mo, an alloy or a compound containing the above substances, having a total film thickness of 100 to 800 nm.

In the case of extracting luminescence from the substrate 810 side as a display side, ITSO (indium tin oxide including silicon oxide, which can be formed by sputtering with the use of a target of ITO including silicon oxide at 2 to 10 wt %) is used as the material for the first electrodes. ITSO has favorable flatness because it is not crystallized by heating. Therefore, ITO is suitable for a material of the first electrodes since it is not particularly necessary to remove roughness by cleaning by rubbing with a porous material made of a polyvinyl alcohol (also referred to as BELLCLEAN cleaning) or polishing. In addition to ITSO, a transparent conductive film such as a light-transmitting conductive oxide film in which indium oxide including silicon oxide is mixed with zinc oxide (ZnO) of 2 to 20% and a transparent conductive film comprising ZnO containing Ga (also referred to as GZO) may be used.

Next, an insulator 829 (referred to as a bank, a partition, or a barrier) covering edge portions of the first electrodes 823R and 823G is formed with the use of a ninth mask. As the insulator 829, an organic resin film that can be obtained by application or a SOG film (for example, a SiOx film including an alkyl group) is used within the range of 0.8 to 1 μm in film thickness.

Next, layers 824 H, 824R, 824G, and 824E each including an organic compound are formed by using evaporation or application. In order to improve reliability, it is preferable to perform degassing by vacuum heating before forming the layer 824H including the organic compound. For example, before evaporation of an organic compound material, it is preferable to perform a heat treatment at 200 to 400° C. in a reduced-pressure atmosphere or an inert atmosphere in order to remove gas contained in the substrate. In the present embodiment, since the highly heat-resistant SiOx film is used to form the interlayer insulating film, it is possible to withstand a heat treatment at high temperatures.

In the case of forming the layer including the organic compound by spin coating, it is preferable to perform baking by vacuum heating after spin coating. For example, for the layer 824H to serve as a hole injecting layer, a solution of poly (ethylenedioxythiophene)/poly(stylene sulfonic acid) (PEDOT/PSS) is applied to the whole area and baked.

Alternatively, the hole injecting layer may be formed by evaporation. For example, an oxide such as molybdenum oxide (MoOx: x=2 to 3) and one of α-NPD and rubrene are co-evaporated to form the hole injecting layer so that the hole injecting property can be improved.

Then, in order to form the layers 824R, 824G; and 824E each including organic compound, deposition is performed by evaporation in a deposition chamber evacuated to a vacuum of $5\times10^{-3}$ Torr (0.665 Pa) or less, preferably $10^{-4}$ to $10^{-6}$ Torr. In deposition, the organic compound is vaporized by resistance heating in advance, and a shutter is opened during evaporation to disperse the organic compound in the direction toward the substrate. The vaporized organic compound disperses upward, passes through an opening provided in a metal mask, and then is deposited on the substrate.

For full range of colors, alignment of a mask of each of luminescent colors (R, G, and B) is performed. Note that full-color display is possible also by an electroluminescent layer capable of showing white luminescence and at least one of color filters, color conversion layers, and the like.

For example, for the layer 824R to serve as a light-emitting layer, $Alq_3$ doped with DCM is deposited to be 40 nm in thickness, and for the layer 824G to serve as a light-emitting layer, $Alq_3$ doped with DMQD is deposited to be 40 nm in thickness. Further, for a light-emitting layer for a blue color (not shown here), PPD (4,4'-bis(N-(9-phenanthryl)-N-phenylamino)biphenyl) doped with CBP (4,4'-bis(N-carbazolyl)-biphenyl) is deposited to be 30 nm in thickness, and SAlq (bis(2-methyl-8-quinolinolato) (triphenylsilanolato) aluminum) is deposited to be 10 nm in thickness for a blocking layer.

Then, for the layer 824E to serve as an electron transporting layer, $Alq_3$ is deposited to be 40 nm in thickness.

Next, a second electrode 825, that is, a cathode (or an anode) of an organic light-emitting element is formed. As a material for the second electrode 825, an alloy such as MgAg, MgIn, AlLi, $CaF_2$, or CaN, or a mixture of materials formed by co-evaporation of element belonging to Group 1 or 2 of the periodic table and aluminum may be used. When the second electrode 825 is made to have a light-transmitting property, a transparent conductive film may be formed.

Before forming the second electrode 825, a light-transmitting layer (1 to 5 nm in film thickness) comprising $CaF_2$, $MgF_2$, or $BaF_2$ may be formed as a cathode buffer layer.

In addition, a protective film (a thin film containing silicon nitride or carbon as its main component) for protecting the second electrode 825 may be formed.

Next, a sealing substrate 833 is bonded with a sealing material 828 to encapsulate the light-emitting element. The sealing substrate 833 is bonded such that an edge portion (a tapered portion) of the highly heat-resistant planarization film 816 is covered with the sealing material 828. The region surrounded by the sealing material 828 is filled with a transparent filling material 827. The filling material 827 is not limited as long as a light-transmitting material is used as the filling material 827. Typically, an ultraviolet curing or thermosetting epoxy resin may be used. In addition, a drying agent may be included in the filling material 827. A highly heat-resistant UV epoxy resin (2500 Clear manufactured by ELECTRO-LITE Corporation that has a refractive index of 1.50, a viscosity of 500 cps, a shore hardness (Shore D) of 90, tensile strength of 3000 psi, a Tg point of 150° C., a volume resistivity of $1\times10^{15}$ O.cm, and a withstand voltage of 450 V/mil is used here. By filling the filling material 827 between the pair of substrates, the total transmittance can be improved.

After forming a pattern of the sealing material 828 on the sealing substrate 833 by droplet discharging method in an inert gas atmosphere or under reduced pressure, the sealing material 827 may be dropped with the use of an ink-jet system or a dispenser system, and the pair of substrates may be bonded under reduced pressure so as to prevent bubbles from entering. At the same time as bonding, the sealing material 828 may be cured under reduced pressure by performing ultraviolet irradiation, a heat treatment, or a heat treatment in addition to ultraviolet irradiation.

Alternatively, the region surrounded by the sealing material 828 is filled with a dried inert gas. In the case of filling the region with a gas, it is preferable that a portion of the sealing substrate 833 is removed to form a depressed portion and a drying agent is put in the depressed portion.

Figure 8A:
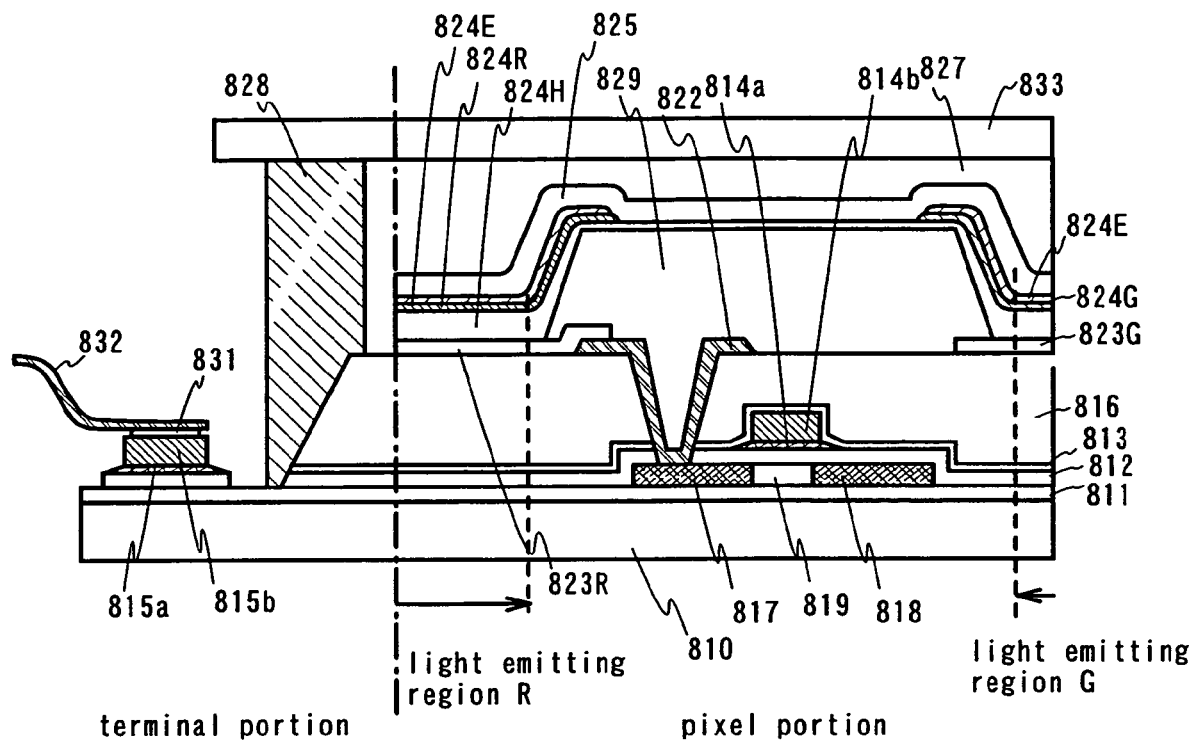
FIGS. 8A and 8B are diagrams illustrating the structure of an active matrix EL display device (Embodiment 1)

Finally, a FPC 832 is attached to the terminal electrodes 815a and 815b with an anisotropic conductive film 831 by a known method. The terminal electrodes 815a and 815b are formed at the same time as a gate wiring (FIG. 8A). When the first electrodes 823R and 823G are formed, a transparent conductive film may be formed on the terminal electrodes 815a and 815b.

Figure 8B:
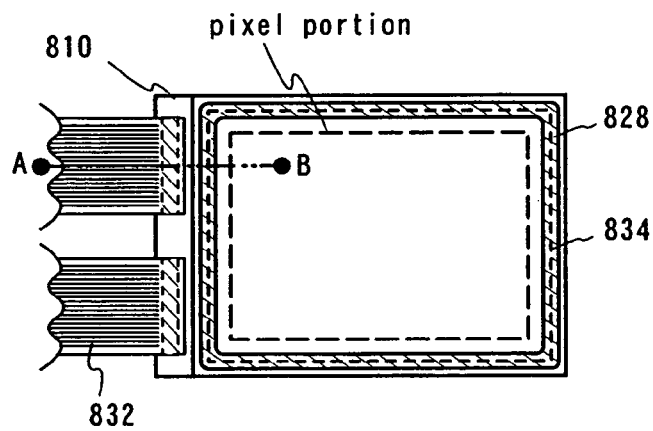

In addition, FIG. 8B shows a top view. As shown in FIG. 8B, an edge portion 834 of the highly heat-resistant planarization film is covered with the sealing material 828. Note that a cross-sectional view of FIG. 8B cut along the chain double-dashed line A-B corresponds to FIG. 8A.

In the thus manufactured active matrix light-emitting device, the highly heat-resistant planarization film 816, specifically a material that has a framework structure comprising a bond of silicon (Si) and oxygen (O), is used as an interlayer insulating film for the TFT, and silicon oxide is included also in the first electrode. By using materials including silicon oxide, which is relatively stable, as constituent materials of the active matrix light-emitting device, the reliability of the light-emitting device is improved.

When a transparent material is used to form the first electrode and a metal material is used to form the second electrode, a structure from which light is extracted through the substrate 810, that is, a bottom emission type, is obtained. When a metal material is used to form the first electrode and a transparent material is used to form the second electrode, a structure from which light is extracted through the sealing substrate 833, that is, a top emission type, is obtained. When transparent materials are used to form the first and second electrodes, a structure from which light is extracted through both the substrate 810 and the sealing substrate 833 is obtained. The present invention may appropriately employ any one of the structure described above.

In the display device according to the present invention, the driving method for an image display is not specifically limited. For example, a dot-sequential driving method, a line sequential driving method, or a frame-sequential driving method may be employed. Typically, the line-sequential driving method is employed, where a time-division gray scale driving method or an area gray scale driving method may be appropriately employed. An image signal input to a source line of the display device may be either an analog signal or a digital signal. In addition, a driver circuit of the display device may be designed appropriately in accordance with the image signal.

As for a display device using a digital video signal, there are a display device in which a video signal with a constant voltage (CV) is input to a pixel and a display device in which a video signal with a constant current (CC) is input to a pixel. The display device using a video signal with a constant voltage (CV) includes a display device in which a constant voltage is applied to a light-emitting element (CVCV) and a display device in which a constant current is applied to a light-emitting element (CVCC). In addition, the display device using a video signal with a constant current (CC) includes a display device in which a constant voltage is applied to a light-emitting element (CCCV) and a display device in which a constant current is applied to a light-emitting element (CCCC).

In the light-emitting device according to the present invention, a protective circuit (for example, a protective circuit) for preventing electrostatic breakdown, may be provided.

It is possible to apply the present invention regardless of the TFT structure. For example, a top gate TFT, a bottom gate (inversely staggered) TFT, and a staggered TFT can be used. In addition, the TFT is not limited to a TFT with a single-gate structure. A multigate TFT that has a plurality of channel forming regions, for example, a double-gate TFT may be used.

In order to enhance the contrast, a polarizing plate or a circular polarizing plate may be provided. For example, a polarizing plate or a circular polarizing plate can be provided for one or both of the display sides.

The present embodiment shows an example of forming the semiconductor film in accordance with the process in Embodiment Mode 2. However, the present embodiment is not particularly limited, and the method described in any one of Embodiment Modes 1 to 7 may be used.

Embodiment 2

Figure 9A:
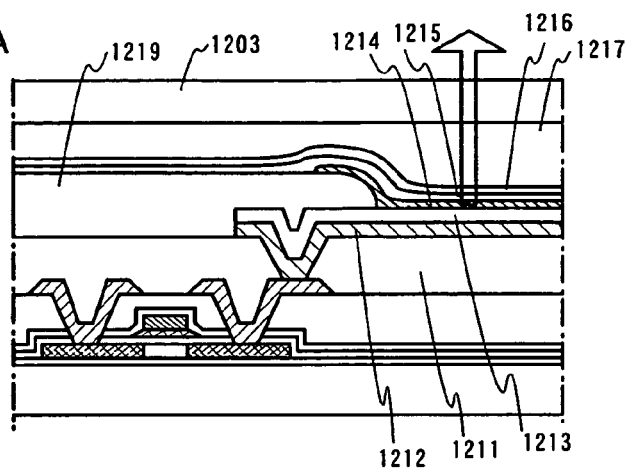
FIGS. 9A to 9D are cross-sectional views illustrating variations of pixel structures.
Figure 9B:
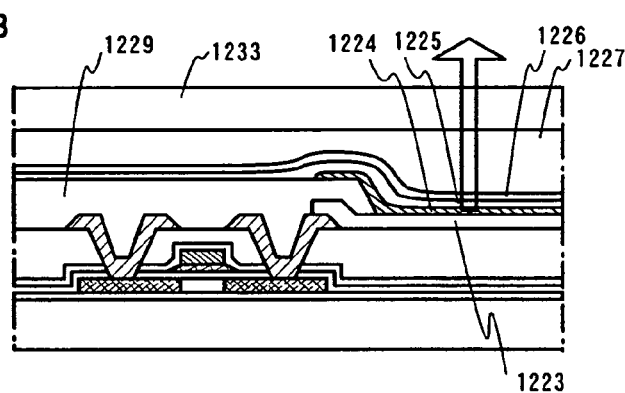
Figure 9C:
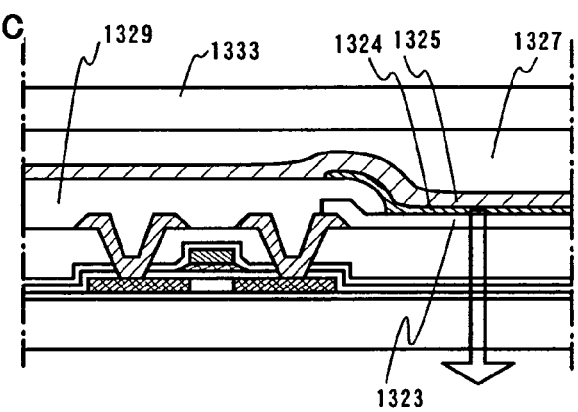

In the present embodiment, an example of bottom emission type light-emitting devices will be described with reference to FIG. 9C.

First, a TFT to be connected to a light-emitting element is formed over a light-transmitting substrate (a glass substrate: a refractive index of about 1.55). Since the light-emitting device is a bottom emission type, highly light-transmitting materials are used for an interlayer insulating film, a gate insulating film, and a base insulating film. As a first interlayer insulating film, a SINO film formed by plasma CVD is used here. In addition, a SiOx film formed by application is used as a second interlayer insulating film.

Next, a first electrode 1323 electrically connected to the TFT is formed. As the first electrode 1323, ITSO (100 nm in film thickness) that is a transparent conductive film including SiOx is used. The ITSO film is formed by sputtering in such a way that a target of indium tin oxide mixed with silicon oxide ($SiO_2$) at 1 to 10% is used and the Ar gas flow rate, $O_2$ gas flow rate, pressure, electric power are respectively controlled to be 120 sccm, 5 sccm, 0.25 Pa, 3.2 kW. Then, after forming the ITSO film, a heat treatment at 200° C. for 1 hour is performed.

Next, a partition 1329 is formed to cover a peripheral edge portion of the first electrode 1323. For the partition 1329, an inorganic material (for example, silicon oxide, silicon nitride, or silicon oxynitride), a photosensitive or non-photosensitive organic material (polyimide, acrylic, polyamide, polyimide-amide, resist, or benzocyclobutene), a SOG film (for example, a SiOx film including an alkyl group) obtained by application, or a lamination layer of these can be used.

In the present embodiment, patterning of the partition 1329 is performed by wet etching so that only an upper portion has a curved surface with a curvature radius. For example, it is preferable that a positive photosensitive acrylic is used for the partition 1329 so as to have a curved surface with a curvature radius at the upper portion. For the partition 1329, any of a negative photosensitive material that becomes insoluble in an etchant by light irradiation and a positive photosensitive material that becomes soluble in an etchant by light irradiation can be used.

Next, a layer 1324 including an organic compound is formed by evaporation or application. In the present embodiment, a light-emitting element for green luminescence is formed. By evaporation, CuPc (20 nm) and NPD (40 nm) are formed, and $Alq_3$ doped with DMQd (37.5 nm), $Alq_3$ (37.5 nm), and $CaF_2$ (1 nm) respectively are further laminated sequentially.

Next, a film formed of an alloy such as MgAg, MgIn, AlLi, $CaF_2$, or CaN, or a film formed by co-evaporation of element belonging to Group 1 or 2 of the periodic table and aluminum is used to form a second electrode 1325. In the present embodiment, Al is deposited to be 200 nm in thickness. In addition, a protective film is formed thereon if necessary.

Next, a sealing substrate 1333 is bonded with the use of a sealing material (not shown). A space 1327 between the sealing substrate 1333 and the second electrode 1325 is filled with an inert gas or a filling material comprising a transparent resin.

According to the steps described above, the bottom emission type light-emitting device is completed. In the present embodiment, the refractive index and film thickness of each layer (the interlayer insulating films, the base insulating film, the gate insulating film, and the first electrode) are determined within an adjustable range so that light reflection at the interface between the layers is suppressed to improve the light extraction efficiency.

The present embodiment can be combined freely with any one of Embodiment Modes 1 to 7 and Embodiment 1.

Embodiment 3

In the present embodiment, an example of top emission type light-emitting devices will be described with reference to FIG. 9A.

First, a TFT to be connected to a light-emitting element is formed over a substrate with an insulating surface. Since the light-emitting device is classified in a top emission type, it is not always necessary to use a highly light-transmitting material for an interlayer insulating film, a gate insulating film, or a base insulating film. In the present embodiment, as a highly stable film, a SiNO film formed by plasma CVD is used for a first interlayer insulating film. In addition, as a highly stable film, a SiOx film formed by application is used for a second interlayer insulating film.

Further, a third interlayer insulating film 1211 is provided. Also for the third interlayer insulating film 1211, a SiOx film formed by application is used.

Next, after forming a contact hole to reach an electrode of the TFT by etching the third interlayer insulating film 1211 selectively, a reflective metal film (an Al—Si film (30 nm in film thickness)), a film comprising a material that has a larger work function (a TiN film (10 nm in film thickness)), and a transparent conductive film (an ITSO film (10 nm to 100 nm in film thickness)) are continuously formed. Then, patterning is performed to form a reflective electrode 1212 and a first electrode 1213 that are electrically connected to the TFT.

Next, a partition 1219 is formed to cover an edge portion of the first electrode 1213. For the partition 1219, an inorganic material (for example, silicon oxide, silicon nitride, or silicon oxynitride), a photosensitive or non-photosensitive organic material (polyimide, acrylic, polyamide, polyimideamide, resist, or benzocyclobutene), a SOG film obtained by application, or a lamination layer of these can be used.

Next, a layer 1214 including an organic compound is formed by using evaporation or application.

Next, a transparent conductive film is used as a second electrode 1215 for the top emission type light-emitting device.

Next, a transparent protective layer 1216 is formed by evaporation or sputtering. The transparent protective layer 1216 protects the second electrode 1215.

Next, a sealing substrate 1203 is bonded with a sealing material to encapsulate the light-emitting element. The region surrounded by the sealing material is filled with a transparent filling material 1217. The filling material 1217 is not limited as long as a light-transmitting material is used as the filling material 1217. Typically, an ultraviolet curing or thermosetting epoxy resin may be used. By filling the filling material 1217 between the pair of substrates, the total transmittance can be improved.

According the steps described above, the top emission type light-emitting device is completed. In the present embodiment, SiOx is included in each layer (the interlayer insulating films, the base insulating film, the gate insulating film, and the first electrode) to improve the reliability.

The present embodiment can be combined freely with any one of Embodiment Modes 1 to 7 and Embodiment 1.

Embodiment 4

In the present embodiment, an example of top emission type light-emitting devices different from Embodiment 3 will be described with reference to FIG. 9B.

First, a TFT to be connected to a light-emitting element is formed over a substrate with an insulating surface. Since the light-emitting device is classified in a top emission type, it is not always necessary to use a highly light-transmitting material for an interlayer insulating film, a gate insulating film, or a base insulating film. In the present embodiment, as a highly stable film, a SiNO film formed by plasma CVD is used for a first interlayer insulating film. In addition, as a highly stable film, a SiOx film formed by application is used for a second interlayer insulating film. By etching the interlayer insulating film and the gate insulating film selectively, contact holes are formed to reach an active layer of the TFT. Then, after forming conductive films (TiN/Al—Si/TiN), etching (dry etching with a mixed gas of $BCl_3$ and $Cl_2$) is performed with the use of mask to form a source electrode and a drain electrode of the TFT.

Next, a first electrode 1223 electrically connected to the drain electrode (or the source electrode) of the TFT is formed. As the first electrode 1223, one film or laminated films mainly including a substance that has a larger work function, for example, TiN, TiSixNy, Ni, W, $WSi_x$, $WN_x$, $WSi_xN_y$, NbN, Cr, Pt, Zn, Sn, In, and Mo, an alloy or a compound containing the above substances, having a total film thickness of 100 to 800 nm.

Next, a partition 1229 is formed to cover a peripheral edge portion of the first electrode 1223. As the partition 1229, an organic resin film or a SOG film (for example, a SiOx film including an alkyl group) that can be obtained by application is used. The partition 1229 is made into a desired shape by dry etching.

Next, a layer 1224 including an organic compound is formed by using evaporation or application.

Next, a transparent conductive film (for example, an ITO film) is used as a second electrode 1225 for the top emission type light-emitting device.

Next, a transparent protective layer 1226 is formed by evaporation or sputtering. The transparent protective layer 1226 protects the second electrode 1225.

Next, a sealing substrate 1233 is bonded with the use of a sealing material to encapsulate the light-emitting element. The region surrounded by the sealing material is filled with a transparent filling material 1227. The filling material 1227 is not limited as long as a light-transmitting material is used as the filling material 1227. Typically, an ultraviolet curing or thermosetting epoxy resin may be used. By filling the filling material 1227 between the pair of substrates, the total transmittance can be improved.

According to the steps described above, the top emission type light-emitting device is completed.

The present embodiment can be combined freely with any one of Embodiment Modes 1 to 7 and Embodiment 1.

Embodiment 5

In the present embodiment, an example of light-emitting devices from which light can be extracted from both substrates will be described with reference to FIG. 9D.

First, a TFT to be connected to a light-emitting element is formed over a light-transmitting substrate (a glass substrate: a refractive index of about 1.55). Since display is realized by transmitting light through the light-transmitting substrate, highly light-transmitting materials are used for an interlayer insulating film, a gate insulating film, and a base insulating film. As a first interlayer insulating film, a SiNO film formed by plasma CVD is used here. In addition, a SiOx film formed by application is used as a second interlayer insulating film.

Next, a first electrode 1423 electrically connected to the TFT is formed. As the first electrode 1423, ITSO (100 nm in film thickness) that is a transparent conductive film including SiOx is used.

Next, a partition 1429 is formed to cover a peripheral edge portion of the first electrode 1423. For the partition 1429, an inorganic material (for example, silicon oxide, silicon nitride, or silicon oxynitride), a photosensitive or non-photosensitive organic material (polyimide, acrylic, polyamide, polyimideamide, resist, or benzocyclobutene), a SOG film (for example, a SiOx film including an alkyl group) obtained by application, or a lamination layer of these can be used.

In the present embodiment, patterning of the partition 1429 is performed by wet etching so that only an upper portion has a curved surface with a curvature radius.

Next, a layer 1424 including an organic compound is formed by evaporation or application.

Next, a transparent conductive film is used as a second electrode 1425 since luminescence is extracted also from the sealing substrate side.

Next, a transparent protective layer 1426 is formed by evaporation or sputtering. The transparent protective layer 1426 protects the second electrode 1425.

Next, a sealing substrate 1443 is bonded with the use of a sealing material to encapsulate the light-emitting element. The sealing substrate 1433 is also a light-transmitting substrate (a glass substrate: a refractive index of amount 1.55). The region surrounded by the sealing material is filled with a transparent filling material 1427. The filling material 1427 is not limited as long as a light-transmitting material is used as the filling material 1427. Typically, an ultraviolet curing or thermosetting epoxy resin may be used. By filling the filling material 1427 between the pair of substrates, the total transmittance can be improved.

Figure 9D:
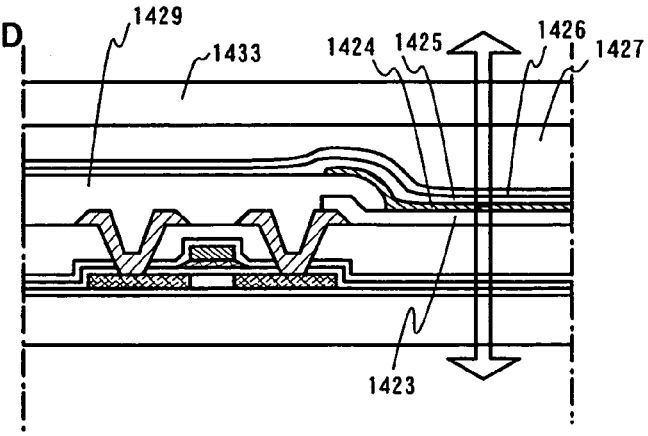

In the light-emitting device shown in FIG. 9D, by arranging two polarizing plates so that a direction to which one of the polarizing plates polarizes light is perpendicular to a direction to which the other polarizes light, it can be prevented that a displayed image is hard to be recognized on seeing from one side of the light emitting device due to the background beyond the light emitting device seen through the light emitting device, which overlaps the displayed image.

The present embodiment can be combined freely with any one of Embodiment Modes 1 to 7 and Embodiment 1.

Embodiment 6

Figure 10:
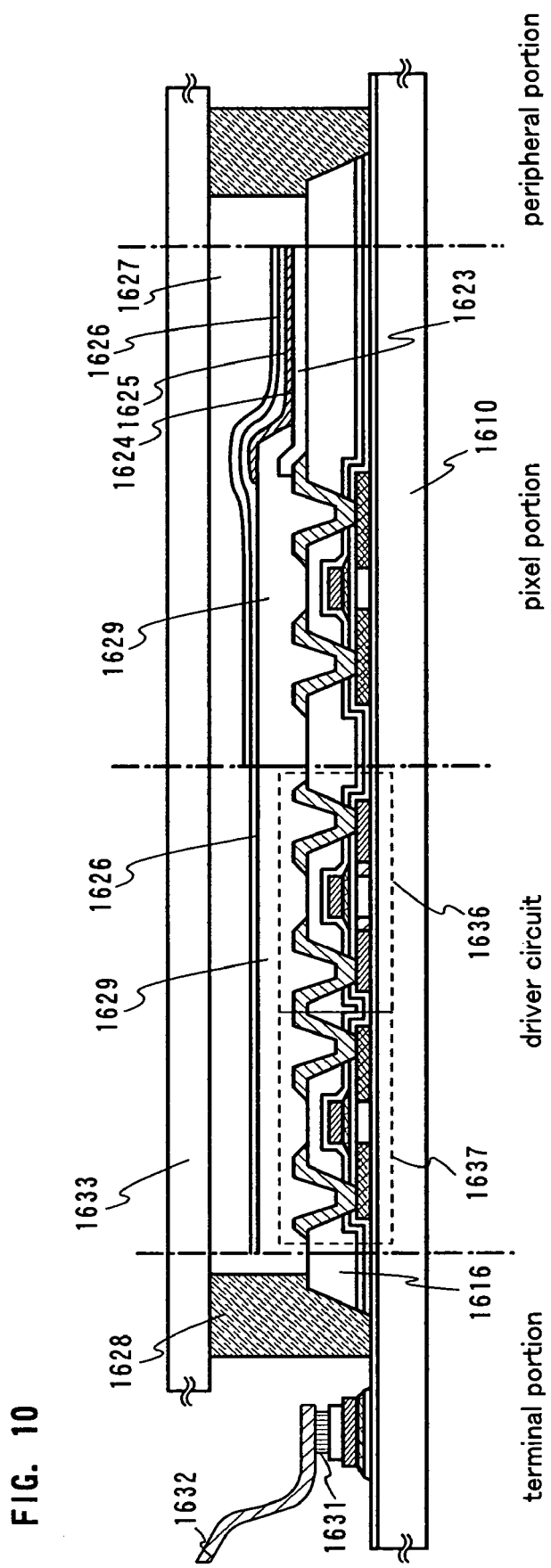
FIG. 10 is a cross-sectional view of an EL display device.

In each of Embodiments 1 to 5, the pixel portion and the terminal portion are illustrated with drawings. In the present embodiment, FIG. 10 shows an example of forming a pixel portion, a driver circuit, and a terminal portion on the same substrate.

After forming a base insulating film on a substrate 1610, semiconductor films are formed. Then, after forming a gate insulating film to cover the semiconductor films, gate electrodes and a terminal electrode are formed. Then, in order to form an n-channel TFT 1636, the semiconductor layer is doped with an impurity element (typically, phosphorous or arsenic) that imparts n-type conductivity to a semiconductor to form a source region and a drain region, and also an LDD region if necessary. In addition, in order to form a p-channel TFT 1637, the semiconductor film is doped with an impurity element (typically, boron) that imparts p-type conductivity to a semiconductor to form a source region and a drain region, and also an LDD region if necessary.

Next, a highly heat-resistant planarization film 1616 to serve as an interlayer insulating film is formed. As the highly heat-resistant planarization film 1616, an insulating film that has a framework structure comprising a bond of silicon (Si) and oxygen (O), which can be obtained by application, is used.

Next, with the use of a mask, a peripheral portion of the interlayer insulating film 1616 is removed while forming contact holes in a SiNO film and the interlayer insulating film 1616. A tapered shape may be obtained by etching once, or a tapered shape may be obtained by etching more than once.

Next, etching is performed with the highly heat-resistant planarization film 1616 as a mask to remove an exposed portion of a SiNO film including hydrogen or the gate insulating film selectively.

Next, forming a conductive film, etching is performed with the use of a mask to form drain wirings and source wirings.

Next, a first electrode 1623 comprising a transparent conductive film, that is, an anode (or a cathode) of an organic light-emitting element is formed. At the same time, the transparent conductive film is formed on the terminal electrode.

In the subsequent steps, as well as in Embodiment 1, an insulator 1629, a layer 1624 including an organic compound, a second electrode 1625 formed of a conductive film, and a transparent protective film 1626 are formed, and a sealing substrate 1633 is bonded with the use of a sealing material 1628 to encapsulate the light-emitting element. The region surrounded by the sealing material 1628 is filled with a transparent filling material 1627. Finally, a FPC 1632 is attached to the terminal electrode with an anisotropic conductive film 1631 by a known method. It is preferable to use a transparent conductive film for the terminal electrode, and a transparent conductive film is formed on the terminal electrode formed at the same time as a gate wiring.

According to the steps described above, a pixel portion, a driver circuit, and a terminal portion are formed on the same substrate. Since an n-channel TFT and a p-channel TFT can be formed over the same substrate as shown in the present embodiment, a driver circuit and a protective circuit can be formed on the substrate so that IC chips mounted on the substrate over which the pixel portion is formed are not so many.

In addition, the light-emitting device according to the present invention is not limited to a structure in which an n-channel TFT and a p-channel TFT are formed on the same substrate. The pixel portion and the driver circuit may be formed of only n-channel TFTs or only p-channel TFTs to reduce the steps.

Embodiment 7

In the present embodiment, an example of manufacturing an active matrix liquid crystal display device will be described referring to FIG. 11.

First, in accordance with any one of Embodiment Modes 1 to 7, a TFT 1105 including a semiconductor film as an active layer, and the like are formed over a substrate 1100 to form a pixel portion. The pixel portion comprises a pixel electrode 1101 arranged in a matrix manner, a switching element connected to the pixel electrode 1101, a top gate TFT 1105 here, and a capacitor. The capacitor has an insulating film as a dielectric sandwiched between an electrode connected to the pixel electrode 1101 and the semiconductor film. The present invention can realize little unevenness of display due to variation in transmitted light intensity. In addition, since the present invention makes it possible to obtain a flat semiconductor film, an insulating film with a uniform film thickness can be obtained so that variation in holding capacity.

In the present embodiment, in order to realize low OFF current, an example of using a double-gate TFT that has a plurality of channel forming regions is shown.

Then, after forming the pixel portion, formation of an orientation film, a rubbing treatment, dispersion of a spherical spacer or formation of a columnar spacer, formation of a color filter, and the like are performed.

Next, pattern formation of a sealing material is performed on an opposed substrate by droplet discharging method in an inert gas atmosphere or under reduced pressure. The sealing material 1107 is here formed in a predetermined position (a closed pattern surrounding the pixel portion) with the use of a dispenser system or an ink-jet system. As the sealing material 1107, a translucent sealing material that includes a filler (6 to 24 μm in diameter) and has a viscosity of 40 to 400 Pa·s is used. It is preferable to select a sealing material that is insoluble in a liquid crystal with which the sealing material will come in contact later. As the sealing material 1107, a light curing acrylic resin or a thermosetting acrylic resin may be used. In addition, the sealing material can be formed by printing since the sealing pattern is simple in this case. Then, the sealing material 1107 is cured preliminarily.

Figure 11:
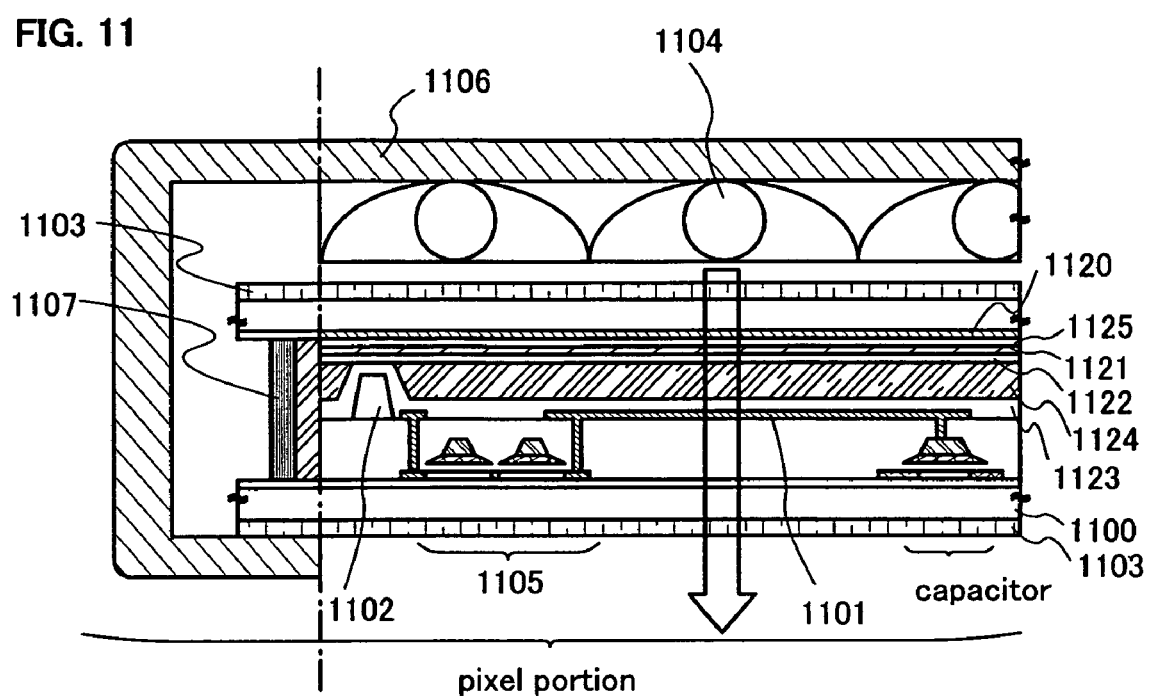
FIG. 11 is a diagram illustrating a cross-sectional structure of an active matrix liquid crystal display device.

Next, a liquid crystal is dropped in the region surrounded by the sealing material 1107 with the use of an ink-jet system or a dispenser system (FIG. 11). As the liquid crystal, a known liquid crystal material that has a viscosity to be able to be discharged with the use of an ink-jet system or a dispenser system may be used. Since the viscosity of a liquid crystal material can be controlled by adjusting the temperature of the liquid crystal material, liquid crystal materials are suitable for droplet discharging method. By using droplet discharging method, only a necessary amount of liquid crystal can be held in the region surrounded by the sealing material 1107.

After dropping the liquid crystal, a pair of substrates are bonded under reduced pressure so as to prevent bubbles from entering. At the same time as bonding, the sealing material 1107 is cured here under reduced pressure by performing ultraviolet irradiation or a heat treatment. A heat treatment may be performed in addition to ultraviolet irradiation.

Next, after dividing the bonded substrates into panel sizes appropriately, an FPC, an IC, and an optical film are appropriately attached to manufacture a liquid crystal module.

Then, by providing a backlight valve 1104 and a mirror for the obtained liquid crystal module and covering with a cover 1106, an active matrix liquid crystal display device (transmissive type) whose cross-sectional view is partially shown in FIG. 11 is completed. Alternatively, an optical waveguide may be used while disposing a backlight outside the display region. The cover 1106 and the liquid crystal module are fixed with the use of an adhesive material or an organic resin. In addition, the active matrix liquid crystal display device is classified in a transmissive type, a polarizing plate 1103 is attached to both the active matrix substrate and the opposed substrate. Further, another optical film (for example, an antireflective film or a polarizing film) and a protective film (not shown) may be provided.

In FIG. 11, reference numeral 1100, 1101, 1102, 1107, 1120, 1125, 1121, 1122 and 1123, 1124, and 1119 respectively denote the substrate, the pixel electrode, a columnar spacer, the sealing material, a color filter (CF) comprising a colored layer and a light shielding layer arranged with respect to each pixel, a planarization film, a counter electrode, orientation films, a liquid crystal layer, and a protective film.

The liquid crystal display device according to the present invention is not limited to a structure in which an n-channel TFT and a p-channel TFT are manufactured on the same substrate. The pixel portion and the driver circuit may be formed of only n-channel TFTs or only p-channel TFTs to reduce the number of the manufacturing steps.

The present embodiment can be combined freely with any one of Embodiment Modes 1 to 7.

Embodiment 8

In the present embodiment, a pixel structure of an EL display panel will be described with reference to equivalent circuit diagrams illustrated in FIGS. 12A to 12F.

Figure 12A:
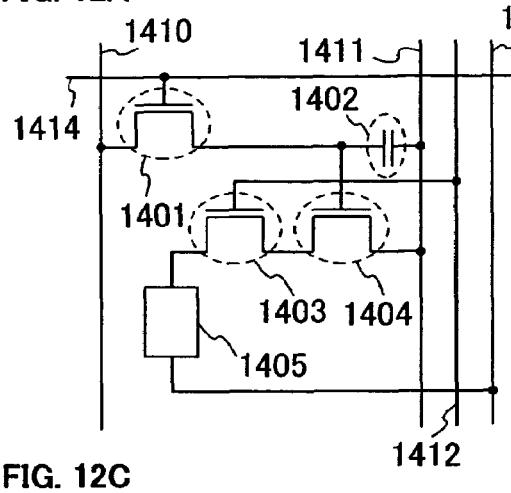
FIGS. 12A to 12F are diagrams illustrating pixel structures that can be applied to an EL display panel according to the present invention.

In the pixel shown in FIG. 12A, a signal line 1410 and power supply lines 1411 to 1413 are arranged in a column direction, and a scan line 1414 is arranged in a row direction. The pixel also includes a switching TFT 1401, a driving TFT 1403, a current controlling TFT 1404, a capacitor 1402, and a light-emitting element 1405.

Figure 12B:
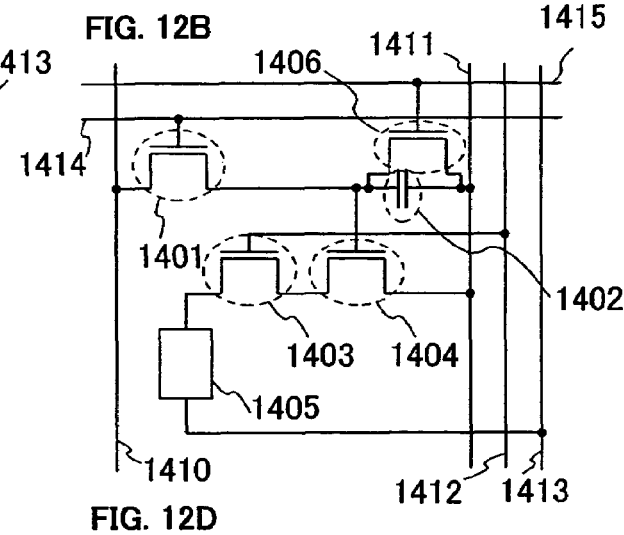
Figure 12C:
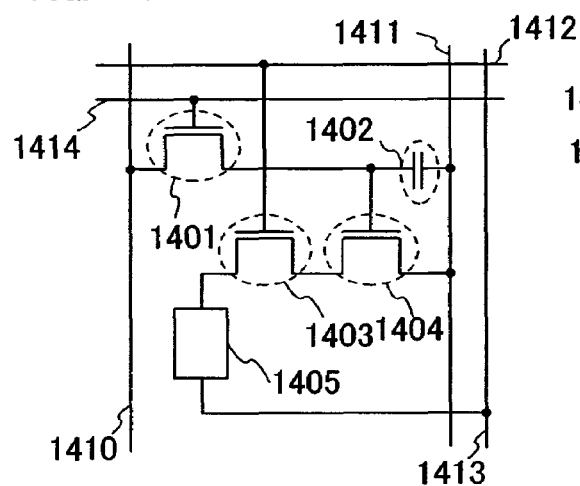
Figure 12D:
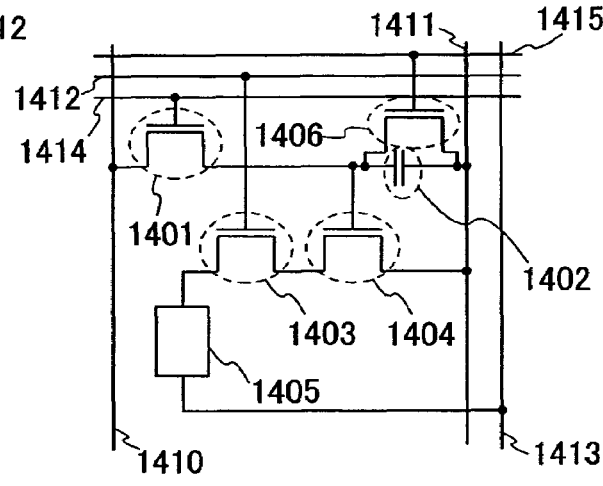

The pixel shown in FIG. 12C, which basically has the same structure as the pixel shown in FIG. 12A, is different only in that a gate electrode of a TFT 1403 is connected to a power supply line 1413 arranged in a row direction. That is to say, each of FIGS. 12A and 12C illustrates the same equivalent circuit diagram. However, compared to the case where the power supply line 1412 is arranged in the row direction (FIG. 12A) to the case where the power supply line 1412 is arranged in the column direction (FIG. 12C), each of the power supply lines is formed by using a conductive layer of a different layer. In the present embodiment, attention is given to the wiring connected to the gate electrode of the driving TFT 1403, and FIGS. 12A and 12C are separately illustrated to indicate that the layers for forming these wirings are different from each other.

Each of the pixels shown in FIGS. 12A and 12C includes features that the TFTs 1403 and 1404 are connected in series in the pixel, and that the channel length $L_3$ and channel width $W_3$ of the TFT 1403 and the channel width $L_4$ and channel width $W_4$ of the TFT 1404 are set to satisfy $L_3/W_3:L_4/W_4=5$ to 6000:1. In an example of cases that satisfy 6000: 1, $L_3$ is 500 μm, $W_3$ is 3 μm, $L_4$ is 3 μm, and $W_4$ is 100 μm.

Note that the TFT 1403 operates in the saturation region and functions to control a current value that flows in the light-emitting element 1405 while the TFT 1404 operates in the linear region and functions to control supply of current to the light-emitting element 1405. Both of the TFTs preferably have the same conductivity in the light of the manufacturing steps. The TFT 1403 may be a depletion mode TFT as well as an enhancement mode TFT. According to the present invention, which has the structure described above, the TFT 1404 operates in the linear region. Therefore, slight fluctuation in Vgs of the TFT 1404 has no influence on the current value supplied to the light-emitting element 1405. Namely, the current value supplied to the light-emitting element 1405 is determined by the TFT 1403, which operates in the saturation region. The present invention, which has the structure described above, makes it possible to provide a display device in which luminance unevenness of light-emitting elements due to variations in characteristics of TFTs is improved to enhance image quality.

In each of the pixels shown in FIGS. 12A to 12D, the TFT 1401 controls input of a video signal to the pixel. When the TFT 1401 is turned ON to input a video signal to the pixel, the video signal is held in the capacitor 1402. Although each of FIGS. 12A and 12C shows the structure in which the capacitor 1402 is provided, the present invention is not limited to this. It is unnecessary to provide the capacitor 1402 expressly when a gate capacitance or the like can substitute for the capacitor for holding a video signal.

The light-emitting element 1405 has a structure in which an electroluminescent layer is interposed between two electrodes, and a potential difference is provided between a pixel electrode and an opposed electrode (between an anode and a cathode) so as to apply a voltage in a forward bias direction. The electroluminescent layer comprises any of a wide variety of materials such as organic materials and inorganic materials, and luminescence in the electroluminescent layer includes light emission on returning from a singlet excited state to the ground state (fluorescence) and light emission on returning from a triplet excited state to the ground state (phosphorescence).

The pixel shown in FIG. 12B, which basically has the same pixel structure as FIG. 12A, is different only in that a TFT 1406 and a scan line 1415 are additionally provided. Similarly, the pixel shown in FIG. 12D, which has the same pixel configuration as FIG. 12C, is only different in that a TFT 1406 and a scan line 1416 are additionally provided.

The switching (ON/OFF) of the TFT 1406 is controlled by the scan line 1415 provided additionally. When the TFT 1406 is turned ON, a charge held in the capacitor 1402 is discharged to turn OFF the TFT 1404. Namely, the arrangement of the TFT 1406 makes it possible to bring the light-emitting element 1405 forcibly into a state where no current flows thereto. Thus, in the structures shown in FIGS. 12B and 12D, an emission period can be started simultaneously with or immediately after a writing period without awaiting completion of writing signals to all pixels, thereby improving the duty ratio.

Figure 12E:
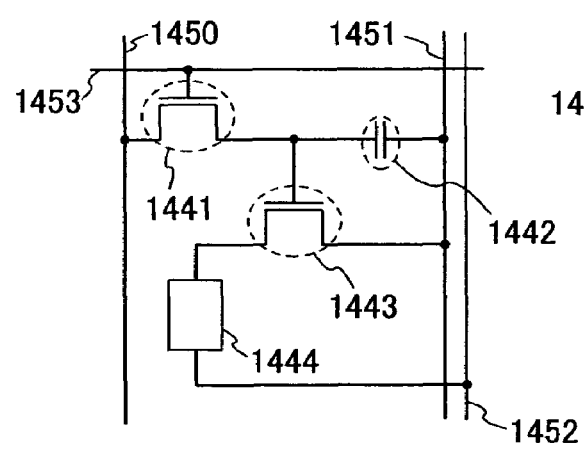
Figure 12F:
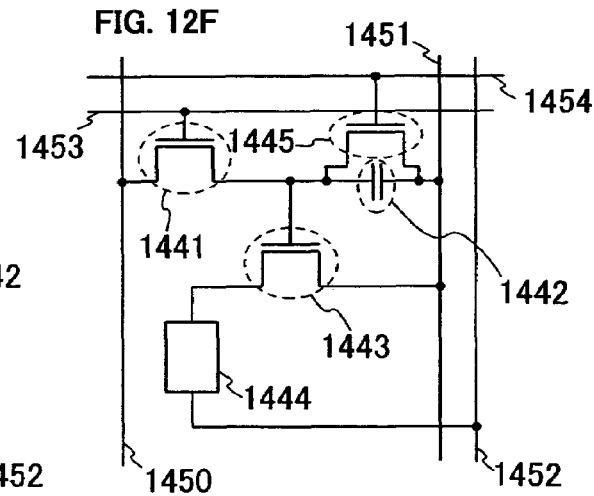

In the pixel shown in FIG. 12E, a signal line 1450 and power supply lines 1411 and 1452 are arranged in a column direction, and a scan line 1453 is arranged in a row direction. The pixel also includes a switching TFT 1441, a driving TFT 1443, a capacitor 1442 and a light-emitting element 1444. The pixel shown in FIG. 12F, which basically has the same pixel structure as FIG. 12E, is different only in that a TFT 1445 and a scan line 1454 are additionally provided. Also in the structure shown in FIG. 12F, the arrangement of the TFT 1445 makes it possible to improve the duty ratio.

The present embodiment can be combined freely with any one of Embodiment Modes 1 to 7.

Embodiment 9

Figure 13A:
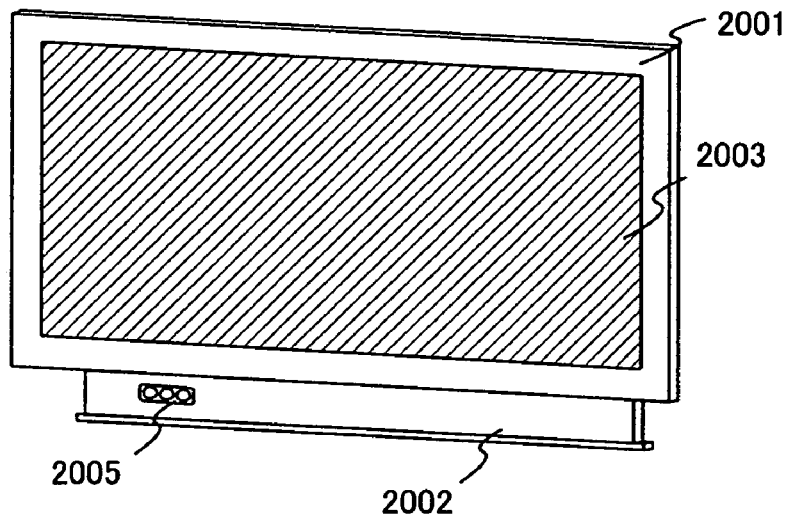

As examples of display devices and electronic devices according to the present invention, a video camera, a digital camera, a goggle-type display (head mount display), a navigation system, a sound reproduction device (such as an in-car audio system or an audio set), a laptop personal computer, a game machine, a personal digital assistance (such as a mobile computer, a cellular phone, a portable game machine, or an electronic book), and an image reproduction device equipped with a recording medium (specifically, a device equipped with a display, which can reproduce a recording medium such as a digital versatile disc (DVD) and display the image) can be given. FIGS. 13A and 13E show specific examples of the electronic devices.

FIG. 13A is a large-sized display device that has a large screen from 22 to 50 inches, which includes a frame body 2001, a support 2002, a display portion 2003, and a video input terminal 2005. The display device includes all devices for displaying information such as for a computer and for receiving TV broad casting. The present invention makes it possible to complete a large-sized display device that has display unevenness reduced with a higher yield even though a large screen from 22 to 50 inches is employed.

Figure 13B:
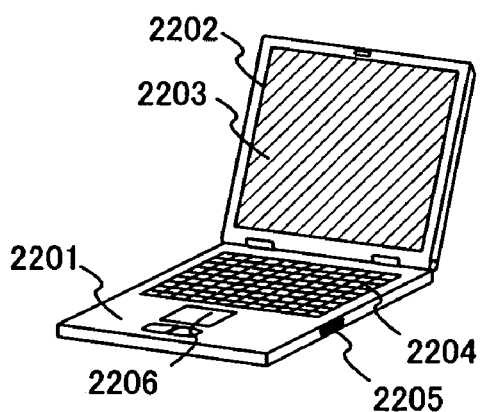

FIG. 13B is a laptop personal computer, which includes a main body 2201, a frame body 2202, a display portion 2203, a keyboard 2204, an external connection port 2205, and pointing mouse 2206. The present invention makes it possible to complete a laptop personal computer that has display unevenness reduced with a higher yield.

Figure 13C:
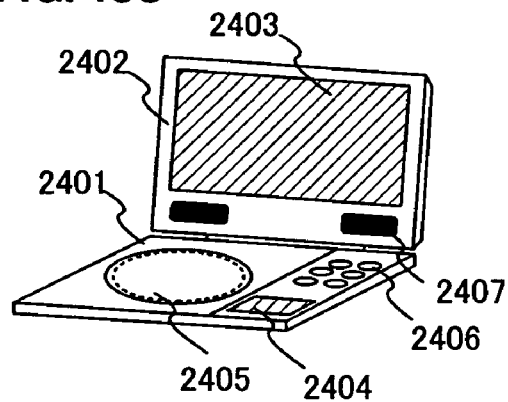

FIG. 13C is a portable image reproduction device equipped with a recording medium (specifically, a DVD reproduction device), which includes a main body 2401, a frame body 2402, a display portion A 2403, a display portion B 2404, a recording medium (such as DVD) reading portion 2405, an operation key 2406, a speaker portion 2407. The display portion A 2403 is used mainly for displaying image information while the display portion B 8404 is used mainly for displaying character information. The image reproduction device equipped with the recording medium further includes a home game machine. The present invention makes it possible to complete an image reproduction device that has display unevenness reduced with a higher yield.

Figure 13D:
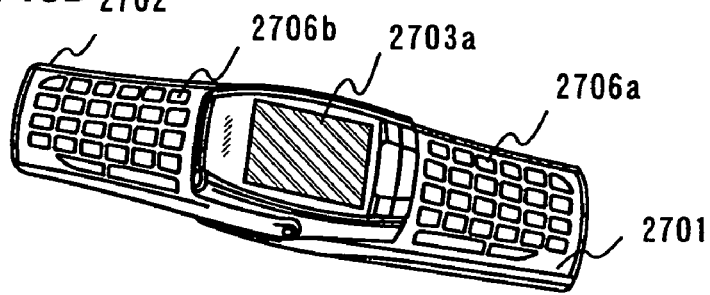
Figure 13D:
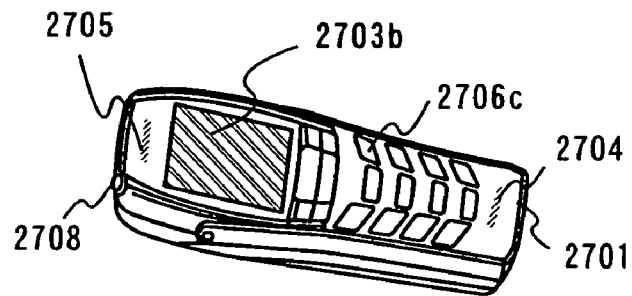

FIG. 13D is a perspective view of a personal digital assistance, and FIG. 13E is a perspective view illustrating a state in which the personal digital assistance is folded to use as a cellular phone. In the case of FIG. 13D, as in the case of using a keyboard, a user operates an operation key 2706a with a finger of his/her right hand while operating an operation key 2706b with a finger of his/her let hand. The present invention makes it possible to complete a personal digital assistance that has display unevenness reduced with a higher yield.

As shown in FIG. 13E, in the case of being folded, a voice input portion 2704, a voice output portion 1705, an operation key 2706, an antenna 2708, and the like are used while holding a main body and a frame body 2707 with one hand.

The personal digital assistance shown in FIGS. 13D and 13E has a high-definition display portion 2703a mainly for displaying images and characters laterally and a display portion 2703b for displaying vertically.

As described above, various electronic device can be completed by implementation of the present invention, that is, using any one manufacturing method or structure of Embodiment Modes 1 to 7 and Embodiments 1 to 8.

The present invention can reduce defective pixels such as point defects to improve a yield.

In addition, in the case of a light-emitting device that has a layer including an organic compound as a light-emitting layer (a light-emitting device that has an EL element), the present invention can suppress variations in OFF current of TFT and reduce display defects such as variations in luminance. Further, in the case of a transmissive liquid crystal display device, display defects due to variations in transmitted light intensity can be reduced.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A method for manufacturing a semiconductor device, comprising:
    forming a first semiconductor film on an insulating surface;
    irradiating the first semiconductor film with laser light;
    forming an oxide film at a surface of the first semiconductor film;
    forming a second semiconductor film by patterning the first semiconductor film;
    oxidizing a surface of the second semiconductor film by using a solution comprising ozone;
    heating the second semiconductor film for forming a third semiconductor film;
    forming a fourth semiconductor film comprising a rare gas element over the third semiconductor film; and
    adding an impurity to the third semiconductor film to form source and drain regions.

2. The method according to claim 1, wherein the step forming the first semiconductor film comprises:
    forming a semiconductor film comprising an amorphous structure on the insulating surface;
    adding a metal element to the semiconductor film comprising the amorphous structure;
    crystallizing the semiconductor film comprising the amorphous structure to form a semiconductor film comprising a crystalline structure; and
    removing an oxide film at the surface of the semiconductor film comprising the crystalline structure.

3. The method according to claim 2, wherein the metal element comprises at least one selected from the group consisting of Fe, Ni, Co, Ru, Rh, Pd, Os, Ir, Pt, Cu, and Au.

4. The method according to claim 1, wherein an oxide film formed by irradiating the first semiconductor film with the laser light is removed between the step of irradiating the first semiconductor film with the laser light and the step of forming the oxide film at the surface of the first semiconductor film.

5. A method for manufacturing a semiconductor device, comprising:
    forming a first semiconductor film on an insulating surface;
    irradiating the first semiconductor film with laser light;
    forming an oxide film at a surface of the first semiconductor film;
    forming a semiconductor film by patterning the first semiconductor film;
    heating the first semiconductor film to form a second semiconductor film; oxidizing a surface of the second semiconductor film by using a solution comprising ozone;
    forming a fourth semiconductor film comprising a rare gas element over the second semiconductor film; and
    adding an impurity to the second semiconductor film to form source and drain regions.

6. The method according to claim 5, wherein the step forming the first semiconductor film comprises:
forming a semiconductor film comprising an amorphous structure on the insulating surface;
adding a metal element to the semiconductor film comprising the amorphous structure;
crystallizing the semiconductor film comprising the amorphous structure to form a semiconductor film comprising a crystalline structure; and
removing an oxide film at the surface of the semiconductor film comprising the crystalline structure.

7. The method according to claim 6, wherein the metal element comprises at least one selected from the group consisting of Fe, Ni, Co, Ru, Rh, Pd, Os, Ir, Pt, Cu, and Au.

8. The method according to claim 5, wherein an oxide film formed by irradiating the first semiconductor film with the laser light is removed between the step of irradiating the first semiconductor film with the laser light and the step of forming the oxide film at the surface of the first semiconductor film.

9. A method for manufacturing a semiconductor device, comprising:
forming a first semiconductor film on an insulating surface;
irradiating the first semiconductor film with laser light;
forming an oxide film at a surface of the first semiconductor film;
forming a second semiconductor film by patterning the first semiconductor film;
heating the second semiconductor film to form a third semiconductor film;
oxidizing a surface of the third semiconductor film by using a solution comprising ozone;
heating the third semiconductor film to form a fourth semiconductor film;
forming a fifth semiconductor film comprising a rare gas element over the fourth semiconductor film; and
adding an impurity to the fourth semiconductor film to form source and drain regions.

10. The method according to claim 9, wherein the step forming the first semiconductor film comprises:
forming a semiconductor film comprising an amorphous structure on the insulating surface;
adding a metal element to the semiconductor film comprising the amorphous structure;
crystallizing the semiconductor film comprising the amorphous structure to form a semiconductor film comprising a crystalline structure; and
removing an oxide film at the surface of the semiconductor film comprising the crystalline structure.

11. The method according to claim 10, wherein the metal element comprises at least one selected from the group consisting of Fe, Ni, Co, Ru, Rh, Pd, Os, Ir, Pt, Cu, and Au.

12. The method according to claim 9, wherein an oxide film formed by irradiating the first semiconductor film with the laser light is removed between the step of irradiating the first semiconductor film with the laser light and the step of forming the oxide film at the surface of the first semiconductor film.

13. A method for manufacturing a semiconductor device, comprising:
forming a first semiconductor film comprising an amorphous structure on an insulating surface;
adding a metal element to the first semiconductor film comprising the amorphous structure;
crystallizing the first semiconductor film to form a second semiconductor film comprising a crystalline structure;
irradiating the second semiconductor film with laser light;
forming a third semiconductor film by patterning the second semiconductor film;
performing a first heat treatment of the third semiconductor film;
oxidizing a surface of the third semiconductor film by using a solution comprising ozone to form an oxide film after the step of performing the first heat treatment of the third semiconductor film;
forming a fourth semiconductor film comprising a rare gas element over the oxide film;
performing a second heat treatment to reduce the metal element in the third semiconductor film by gettering of the metal element into the fourth semiconductor film;
removing the fourth semiconductor film; and
removing the oxide film.

14. The method according to claim 13, wherein an oxide film formed at a surface of the second semiconductor film is removed before the step of the laser light irradiation.

15. The method according to claim 13, wherein an oxide film formed by the laser light irradiation is removed after the step of the laser light irradiation.

16. The method according to claim 13, wherein the oxide film is one of a silicon oxide film and a silicon oxynitride film of 1 to 10 nm in film thickness.

17. The method according to claim 13, wherein the metal element comprises at least one selected from the group consisting of Fe, Ni, Co, Ru, Rh, Pd, Os, Ir, Pt, Cu, and Au.

18. The method according to claim 13, wherein the rare gas element is at least one selected from the group consisting of He, Ne, Ar, Kr, and Xe.

19. A method for manufacturing a semiconductor device, comprising:
forming a first semiconductor film comprising an amorphous structure on an insulating surface;
adding a metal element to the first semiconductor film comprising the amorphous structure;
crystallizing the first semiconductor film to form a second semiconductor film comprising a crystalline structure;
irradiating the second semiconductor film with laser light;
forming a third semiconductor film by patterning the second semiconductor film;
oxidizing a surface of the third semiconductor film by using a solution comprising ozone to form an oxide film;
performing a first heat treatment of the second third semiconductor film after the step of oxidizing the surface of the third semiconductor film;
forming a fourth semiconductor film including a rare gas element over the oxide film;
performing a second heat treatment to reduce the metal element in the third semiconductor film by gettering of the metal element into the fourth semiconductor film;
removing the fourth semiconductor film; and
removing the oxide film.

20. The method according to claim 19, wherein an oxide film formed at a surface of the second semiconductor film is removed before the step of the laser light irradiation.

21. The method according to claim 19, wherein an oxide film formed by the laser light irradiation is removed after the step of the laser light irradiation.

22. The method according to claim 19, wherein the oxide film is one of a silicon oxide film and a silicon oxynitride film of 1 to 10 nm in film thickness.

23. The method according to claim 19, wherein the metal element comprises at least one selected from the group consisting of Fe, Ni, Co, Ru, Rh, Pd, Os, U, Pt, Cu, and Au.

24. The method according to claim 19, wherein the rare gas element is at least one selected from the group consisting of He, Ne, Ar, Kr, and Xe.

25. A method for manufacturing a semiconductor device, comprising:
- forming a first semiconductor film comprising an amorphous structure on an insulating surface;
- adding a metal element to the first semiconductor film comprising the amorphous structure;
- crystallizing the first semiconductor film to form a second semiconductor film including a crystalline structure;
- irradiating the second semiconductor film with laser light;
- performing a first heat treatment of the second semiconductor film after the step of irradiating the second semiconductor film with the laser light;
- oxidizing a surface of the second semiconductor film by using a solution including ozone to form an oxide film after the step of performing the first heat treatment of the second semiconductor film;
- performing a second heat treatment of the second semiconductor film after the step of oxidizing the surface of the second semiconductor film;
- forming a third semiconductor film comprising a rare gas element over the oxide film;
- performing a third heat treatment to reduce the metal element in the second semiconductor film by gettering of the metal element into the third semiconductor film;
- removing the third semiconductor film; and
- removing the oxide film.

26. The method according to claim 25, wherein an oxide film formed at a surface of the second semiconductor film is removed before the step of the laser light irradiation.

27. The method according to claim 25, wherein an oxide film formed by the laser light irradiation is removed after the step of the laser light irradiation.

28. The method according to claim 25, wherein the oxide film is one of a silicon oxide film and a silicon oxynitride film of 1 to 10 nm in film thickness.

29. The method according to claim 25, wherein the metal element comprises at least one selected from the group consisting of Fe, Ni, Co, Ru, Rh, Pd, Os, U, Pt, Cu, and Au.

30. The method according to claim 25, wherein the rare gas element is at least one selected from the group consisting of He, Ne, Ar, Kr, and Xe.

* * * * *